(12) United States Patent
Currie et al.

(10) Patent No.: US 7,566,606 B2
(45) Date of Patent: Jul. 28, 2009

(54) METHODS OF FABRICATING SEMICONDUCTOR DEVICES HAVING STRAINED DUAL CHANNEL LAYERS

(75) Inventors: Matthew T. Currie, Brookline, MA (US); Anthony J. Lochtefeld, Somerville, MA (US); Christopher W. Leitz, Nashua, NH (US); Eugene A. Fitzgerald, Windham, NH (US)

(73) Assignee: AmberWave Systems Corporation, Salem, NH (US)

( * ) Notice: Subject to any disclaimer, the term of this patent is extended or adjusted under 35 U.S.C. 154(b) by 95 days.

(21) Appl. No.: 11/544,245

(22) Filed: Oct. 6, 2006

(65) Prior Publication Data

US 2007/0032009 A1 Feb. 8, 2007

Related U.S. Application Data

(62) Division of application No. 10/456,926, filed on Jun. 6, 2003, now Pat. No. 7,138,310.

(60) Provisional application No. 60/386,969, filed on Jun. 7, 2002.

(51) Int. Cl.
*H01L 21/00* (2006.01)
(52) U.S. Cl. .................. 438/199; 438/200; 438/183
(58) Field of Classification Search ......... 438/199–200, 438/183
See application file for complete search history.

(56) References Cited

U.S. PATENT DOCUMENTS

| | | |
|---|---|---|
| 4,497,683 A | 2/1985 | Celler et al. |
| 4,692,992 A | 9/1987 | Hsu |

(Continued)

FOREIGN PATENT DOCUMENTS

DE 41 01 167 A1 7/1992

(Continued)

OTHER PUBLICATIONS

"2 Bit/Cell EEPROM Cell Using Band-to-Band Tunneling for Data Read-Out," IBM Technical Disclosure Bulletin, vol. 35, No. 4B (Sep. 1992) pp. 136-140.

(Continued)

*Primary Examiner*—Laura M Menz
(74) *Attorney, Agent, or Firm*—Goodwin Procter LLP

(57) ABSTRACT

A semiconductor structure includes a strain-inducing substrate layer having a germanium concentration of at least 10 atomic %. The semiconductor structure also includes a compressively strained layer on the strain-inducing substrate layer. The compressively strained layer has a germanium concentration at least approximately 30 percentage points greater than the germanium concentration of the strain-inducing substrate layer, and has a thickness less than its critical thickness. The semiconductor structure also includes a tensilely strained layer on the compressively strained layer. The tensilely strained layer may be formed from silicon having a thickness less than its critical thickness. A method for fabricating a semiconductor structure includes providing a substrate, providing a compressively strained semiconductor on the substrate, depositing a tensilely strained semiconductor adjacent the substrate until a thickness of a first region of the tensilely strained semiconductor is greater than a thickness of a second region of the tensilely strained semiconductor, forming a n-channel device on the first region, and forming a p-channel device on the second region.

16 Claims, 9 Drawing Sheets

U.S. PATENT DOCUMENTS

| | | | |
|---|---|---|---|
| 4,710,788 A | 12/1987 | Dambkes et al. | |
| 4,920,076 A | 4/1990 | Holland et al. | |
| 4,990,979 A | 2/1991 | Otto | |
| 5,079,447 A | 1/1992 | Lien et al. | |
| 5,089,872 A | 2/1992 | Ozturk et al. | |
| 5,155,571 A | 10/1992 | Wang et al. | |
| 5,241,197 A | 8/1993 | Murakami et al. | |
| 5,242,847 A | 9/1993 | Ozturk et al. | |
| 5,266,510 A | 11/1993 | Lee | |
| 5,266,521 A | 11/1993 | Lee et al. | |
| 5,291,439 A | 3/1994 | Kauffmann et al. | |
| 5,312,766 A | 5/1994 | Aronowitz et al. | |
| 5,327,375 A | 7/1994 | Harari | |
| 5,442,205 A | 8/1995 | Brasen et al. | |
| 5,461,243 A | 10/1995 | Ek et al. | |
| 5,479,033 A | 12/1995 | Baco et al. | |
| 5,523,592 A | 6/1996 | Nakagawa et al. | |
| 5,534,713 A | 7/1996 | Ismail et al. | |
| 5,596,527 A | 1/1997 | Tomioka et al. | |
| 5,617,351 A | 4/1997 | Bertin et al. | |
| 5,683,934 A | 11/1997 | Candelaria | |
| 5,739,567 A | 4/1998 | Wong | |
| 5,777,347 A | 7/1998 | Bartelink | |
| 5,780,922 A | 7/1998 | Mishra | |
| 5,786,612 A | 7/1998 | Otani et al. | |
| 5,792,679 A | 8/1998 | Nakato | |
| 5,808,344 A | 9/1998 | Ismail et al. | |
| 5,847,419 A | 12/1998 | Imai et al. | |
| 5,891,769 A | 4/1999 | Liaw et al. | |
| 5,906,951 A | 5/1999 | Chu et al. | |
| 5,951,757 A | 9/1999 | Dubbelday et al. | |
| 5,963,817 A | 10/1999 | Chu et al. | |
| 5,986,287 A | 11/1999 | Eberl et al. | |
| 5,998,807 A | 12/1999 | Lustig et al. | |
| 6,013,134 A | 1/2000 | Chu et al. | |
| 6,058,044 A | 5/2000 | Sugiura et al. | |
| 6,059,895 A | 5/2000 | Chu et al. | |
| 6,096,590 A | 8/2000 | Chan et al. | |
| 6,107,653 A | 8/2000 | Fitzgerald | |
| 6,111,267 A | 8/2000 | Fischer et al. | |
| 6,117,750 A | 9/2000 | Bensahel et al. | |
| 6,130,453 A | 10/2000 | Mei et al. | |
| 6,143,636 A | 11/2000 | Forbes et al. | |
| 6,154,475 A | 11/2000 | Soref et al. | |
| 6,204,529 B1 | 3/2001 | Lung et al. | |
| 6,207,977 B1 | 3/2001 | Augusto | |
| 6,228,694 B1 | 5/2001 | Doyle et al. | |
| 6,235,568 B1 | 5/2001 | Murthy et al. | |
| 6,249,022 B1 | 6/2001 | Lin et al. | |
| 6,251,755 B1 | 6/2001 | Furukawa et al. | |
| 6,266,278 B1 | 7/2001 | Harari et al. | |
| 6,281,532 B1 | 8/2001 | Doyle et al. | |
| 6,310,367 B1 * | 10/2001 | Yagishita et al. | 257/190 |
| 6,326,664 B1 | 12/2001 | Chau et al. | |
| 6,339,232 B1 | 1/2002 | Takagi | |
| 6,350,993 B1 | 2/2002 | Chu et al. | |
| 6,399,970 B2 | 6/2002 | Kubo et al. | |
| 6,407,406 B1 | 6/2002 | Tezuka | |
| 6,437,375 B1 | 8/2002 | Beaman | |
| 6,461,945 B1 | 10/2002 | Yu | |
| 6,465,316 B2 | 10/2002 | Hattori et al. | |
| 6,498,359 B2 | 12/2002 | Schmidt et al. | |
| 6,555,839 B2 | 4/2003 | Fitzgerald | |
| 6,563,152 B2 | 5/2003 | Roberds et al. | |
| 6,583,437 B2 | 6/2003 | Mizuno et al. | |
| 6,593,191 B2 | 7/2003 | Fitzgerald | |
| 6,593,625 B2 | 7/2003 | Christiansen et al. | |
| 6,593,641 B1 | 7/2003 | Fitzergald | |
| 6,600,170 B1 | 7/2003 | Xiang | |
| 6,603,156 B2 | 8/2003 | Rim | |
| 6,605,498 B1 | 8/2003 | Murthy et al. | |
| 6,620,664 B2 * | 9/2003 | Ma et al. | 438/183 |
| 6,621,131 B2 | 9/2003 | Murthy et al. | |
| 6,646,322 B2 | 11/2003 | Fitzgerald | |
| 6,649,480 B2 | 11/2003 | Fitzgerald et al. | |
| 6,657,223 B1 | 12/2003 | Wang et al. | |
| 6,677,192 B1 | 1/2004 | Fitzgerald | |
| 6,693,641 B1 | 2/2004 | Mehta et al. | |
| 6,703,648 B1 | 3/2004 | Xiang et al. | |
| 6,703,688 B1 | 3/2004 | Fitzgerald | |
| 6,723,661 B2 | 4/2004 | Fitzergald | |
| 6,724,008 B2 | 4/2004 | Fitzgerald | |
| 6,730,551 B2 | 5/2004 | Lee et al. | |
| 6,737,670 B2 | 5/2004 | Cheng et al. | |
| 6,743,684 B2 | 6/2004 | Liu | |
| 6,759,695 B2 * | 7/2004 | Ma et al. | 257/192 |
| 6,815,279 B2 * | 11/2004 | Yagishita et al. | 438/199 |
| 6,861,318 B2 | 3/2005 | Murthy et al. | |
| 6,885,084 B2 | 4/2005 | Murthy et al. | |
| 6,900,094 B2 | 5/2005 | Hammond et al. | |
| 6,916,694 B2 * | 7/2005 | Hanafi et al. | 438/166 |
| 6,916,727 B2 | 7/2005 | Leitz et al. | |
| 6,921,913 B2 | 7/2005 | Yeo et al. | |
| 6,940,089 B2 | 9/2005 | Cheng et al. | |
| 6,943,087 B1 * | 9/2005 | Xiang et al. | 438/311 |
| 6,974,735 B2 | 12/2005 | Fitzgerald | |
| 7,001,837 B2 | 2/2006 | Ngo et al. | |
| 7,033,869 B1 * | 4/2006 | Xiang et al. | 438/149 |
| 7,083,998 B2 | 8/2006 | Chu et al. | |
| 7,138,310 B2 * | 11/2006 | Currie et al. | 438/199 |
| 7,138,649 B2 | 11/2006 | Currie et al. | |
| 7,141,820 B2 | 11/2006 | Lee et al. | |
| 7,145,167 B1 | 12/2006 | Chu | |
| 7,161,206 B2 * | 1/2007 | Oh et al. | 257/316 |
| 7,163,853 B2 * | 1/2007 | Tu | 438/183 |
| 7,176,537 B2 * | 2/2007 | Lee et al. | 257/407 |
| 7,238,989 B2 | 7/2007 | Yeo et al. | |
| 7,268,065 B2 * | 9/2007 | Lin et al. | 438/510 |
| 7,301,180 B2 | 11/2007 | Lee et al. | |
| 7,402,493 B2 * | 7/2008 | Oh et al. | 438/257 |
| 2001/0003364 A1 | 6/2001 | Sugawara et al. | |
| 2002/0011603 A1 * | 1/2002 | Yagishita et al. | 257/190 |
| 2002/0063292 A1 | 5/2002 | Armstrong et al. | |
| 2002/0100942 A1 | 8/2002 | Fitzgerald et al. | |
| 2002/0125471 A1 | 9/2002 | Fitzgerald et al. | |
| 2002/0140031 A1 | 10/2002 | Rim | |
| 2002/0167048 A1 | 11/2002 | Tweet et al. | |
| 2002/0190284 A1 | 12/2002 | Murthy et al. | |
| 2002/0197803 A1 | 12/2002 | Leitz et al. | |
| 2003/0013323 A1 | 1/2003 | Hammond et al. | |
| 2003/0052334 A1 | 3/2003 | Lee et al. | |
| 2003/0057439 A1 | 3/2003 | Fitzgerald | |
| 2003/0146428 A1 * | 8/2003 | Ma et al. | 257/19 |
| 2003/0227013 A1 | 12/2003 | Currie et al. | |
| 2004/0007724 A1 | 1/2004 | Murthy et al. | |
| 2004/0014276 A1 | 1/2004 | Murthy et al. | |
| 2004/0026765 A1 * | 2/2004 | Currie et al. | 257/616 |
| 2004/0070035 A1 | 4/2004 | Murthy et al. | |
| 2004/0077136 A1 * | 4/2004 | Ma et al. | 438/200 |
| 2004/0084735 A1 | 5/2004 | Murthy et al. | |
| 2004/0119101 A1 | 6/2004 | Schrom et al. | |
| 2004/0142545 A1 | 7/2004 | Ngo et al. | |
| 2004/0173815 A1 | 9/2004 | Yeo et al. | |
| 2005/0017236 A1 | 1/2005 | Sugii et al. | |
| 2005/0045972 A1 * | 3/2005 | Hanafi et al. | 257/412 |
| 2005/0151164 A1 | 7/2005 | Leitz et al. | |
| 2005/0221550 A1 | 10/2005 | Fitzgerald | |
| 2005/0227435 A1 * | 10/2005 | Oh et al. | 438/257 |
| 2006/0071285 A1 * | 4/2006 | Datta et al. | 257/407 |
| 2006/0266997 A1 | 11/2006 | Currie et al. | |
| 2007/0032009 A1 * | 2/2007 | Currie et al. | 438/199 |
| 2007/0063263 A1 * | 3/2007 | Oh et al. | 257/316 |
| 2007/0072354 A1 | 3/2007 | Lee et al. | |
| 2007/0080409 A1 * | 4/2007 | Seliskar | 257/401 |

| 2008/0057653 A1* | 3/2008 | Chidambarrao et al. ..... 438/301 |
| 2008/0128747 A1 | 6/2008 | Lee et al. |
| 2008/0206961 A1 | 8/2008 | Sugii et al. |
| 2008/0242075 A1* | 10/2008 | Oh et al. ..................... 438/594 |

FOREIGN PATENT DOCUMENTS

| EP | 0 683 522 A2 | 11/1995 |
| EP | 0 828 296 | 3/1998 |
| EP | 0 829 908 A2 | 3/1998 |
| EP | 0 838 858 A2 | 4/1998 |
| EP | 0 844 651 A1 | 5/1998 |
| EP | 1 020 900 A2 | 7/2000 |
| EP | 1 174 928 A1 | 1/2002 |
| JP | 6-3122176 | 5/1988 |
| JP | 4-307974 | 10/1992 |
| JP | 7-106446 | 12/1992 |
| JP | 9-219524 | 8/1997 |
| JP | 9-321307 | 12/1997 |
| JP | 11-233744 | 8/1999 |
| JP | 2001-160594 | 6/2001 |
| JP | 2001-168342 | 6/2001 |
| JP | 2000-21783 | 8/2001 |
| JP | 2001-319935 | 11/2001 |
| JP | 2002076334 | 3/2002 |
| JP | 2002-241195 | 8/2002 |
| JP | 2002359188 | 12/2002 |
| JP | 2003023160 | 1/2003 |
| WO | WO 98/59365 | 12/1998 |
| WO | WO 99/53539 | 10/1999 |
| WO | WO 01/54202 A1 | 7/2001 |
| WO | WO 00/54338 | 12/2001 |
| WO | WO 01/93338 A1 | 12/2001 |
| WO | WO 01/99169 A2 | 12/2001 |
| WO | WO 02/13262 A2 | 2/2002 |
| WO | WO 02/15244 A2 | 2/2002 |
| WO | WO 02/47168 A2 | 6/2002 |
| WO | WO 02/071488 A1 | 9/2002 |
| WO | WO 02/071491 A1 | 9/2002 |
| WO | WO 02/071495 A1 | 9/2002 |

OTHER PUBLICATIONS

Aigouy et al., "MOVPE Growth and optical characterization of ZnSe/ZnS strained layer superlattices," Superlattices and Microstructures, vol. 16, No. 1 (1994) pp. 71-76.
Anonymous, "Germanium P-Channel Mosfet," IBM Technical Disclosure Bulletin, vol. 28, No. 2 (Jul. 1, 1985) p. 500.
Armstrong et al., "Design of Si/SiGe Heterojunction Complementary Metal-Oxide-Semiconductor Transistors," IEDM Technical Digest (1995) pp. 761-764.
Armstrong, "Technology for SiGe Heterostructure-Based CMOS Devices," Submitted to the Massachusetts Institute of Technology Department of Electrical Engineering and Computer Science on Jun. 30, 1999, pp. 1-154.
Barradas et al., "RBS analysis of MBE-grown Si/Ge/(001) Si heterostructures with thin, high Ge content SiGe channels for HMOS transistors," Modern Physics Letters B (2001) (abstract).
Bedair, "Atomic layer epitaxy deposition processes," J. Vac. Sci. Technol. B, 12(1):179-185 (1994).
Bouillon et al., "Search for the optimal channel architecture for 0.18/0.12 µm bulk CMOS Experimenatl study," IEEE, (1996) pp. 21.2.1-21.2.4.
Bufler et al., "Hold transport in strained Si1-xGex alloys on Si1-yGey substrates," Journal of Applied Physics, vol. 84, No. 10 (Nov. 15, 1998) pp. 5597-5602.
Canaperi et al., "Preparation of a relaxed Si-Ge layer on an insulator in fabricating high-speed semiconductor devices with strained epitaxial films," Intern. Business Machines Corporation, USA (2002) (abstract).
Carlin et al., "High Efficiency GaAs-on-Si Solar Cells with High Voc Using Graded GeSi Buffers," IEEE (2000) pp. 1006-1011.

Cheng et al., "Electron Mobility Enhancement in Strained-Si n-MOSFETs Fabricated on SiGe-on-Insulator (SGO1) Substrates," IEEE Electron Device Letters, vol. 22, No. 7 (Jul. 2001) pp. 321-323.
Cheng et al., "Relaxed Silicon-Germanium on Insulator Substrate by Layer Transfer," Journal of Electronic Materials, vol. 30, No. 12 (2001) pp. L37-L39.
Cullis et al., "Growth ripples upon strained SiGe epitaxial layers on Si and misfit dislocation interactions," Journal of Vacuum Science and Technology A, vol. 12, No. 4 (Jul./Aug. 1994) pp. 1924-1931.
Cullis et al, "The characteristics of strain-modulated surface undulations formed upon epitaxial Si1-xGex alloy layers on Si," Journal of Crystal Growth, vol. 123 (1992) pp. 333-343.
Currie et al., "Carrier mobilities and process stability of strained Si n- and p-MOSFETs on SiGe virtual substrates," J. Vac. Sci. Technol. B., vol. 19, No. 6 (Nov./Dec. 2001) pp. 2268-2279.
Currie et al., "Controlling threading dislocation densities in Ge on Si using graded SiGe layers and chemical-mechanical polishing," Applied Physics Letters, vol. 72, No. 14 (Apr. 6, 1998) pp. 1718-1720.
Eaglesham et al., "Dislocation-Free Stranski-Krastanow Growth of Ge on Si(100)," Physical Review Letters, vol. 64, No. 16 (Apr. 16, 1990) pp. 1943-1946.
Fischetti et al., "Band structure, deformation potentials, and carrier mobility in strained Si, Ge, and SiGe alloys," J. Appl. Phys., vol. 80, No. 4 (Aug. 15, 1996) pp. 2234-2252.
Fischetti, "Long-range Coulomb interactions in small Si devices. Part II. Effective electronmobility in thin-oxide structures," Journal of Applied Physics, vol. 89, No. 2 (Jan. 15, 2001) pp. 1232-1250.
Fitzgerald et al., "Relaxed GexSi1-x structure for III-V integration with Si and high mobility two-dimensional electron gases in Si," J. Vac. Sci. Technol. B, vol. 10, No. 4 (Jul./Aug. 1992) pp. 1807-1819.
Fitzgerald et al., "Dislocation dynamics in relaxed graded composition semiconductors," Materials Science and Engineering B67, (1999) pp. 53-61.
Fitzgerald et al., "Totally relaxed GexSi1-x layers with low threading dislocation densities grown on Si substrates," Appl. Phys. Lett., vol. 59, No. 7 (Aug. 12, 1991) pp. 811-813.
Gannavaram, et al., "Low Temperature ($\leq 800°$ C) Recessed Junction Selective Silicon-Germanium Source/Drain Technology for sub-70 nm CMOS," IEEE International Electron Device Meeting Technical Digest, (2000), pp. 437-440.
Garone et al., "Silicon vapor phase epitaxial growth catalysis by the presence of germane," Applied Physics Letters, vol. 56, No. 13 (Mar. 26, 1990) pp. 1275-1277.
Ge et al., "Process-Strained Si (PSS) CMOS Technology Featuring 3D Strain Engineering," *IEEE International Electron Devices Meeting Technical Digest*, (2003) pp. 73-76.
Ghani et al., "A 90nm High Volume Manufacturing Logic Technology Featuring Novel 45nm Gate Length Strained Silicon CMOS Transistors," *IEEE International Electron Devices Meeting Technical Digest*, (2003), 978-980.
Ghandhi, VLSI Fabrication Principles Silicon and Gallium Arsenide, 2nd Ed., John Wiley & Sons, Inc., New York, pp. 258-261, 518-522 (1994).
Grützmacher et al., "Ge segregation in SiGe/Si heterostructures and its dependence on deposition technique and growth atmosphere," Applied Physics Letters, vol. 63, No. 18 (Nov. 1, 1993) pp. 2531-2533.
Hackbarth et al., "Alternative to thick MBE-grown relaxed SiGe buffers," Thin Solid Films, vol. 369, No. 1-2 (2000) pp. 148-151.
Hackbarth et al., "Strain relieved SiGe buffers for Si-based heterostructure field-effect transistors," Journal of Crystal Growth, vol. 201 (1999) pp. 734-738.
Hamada et al., "A New Aspect of Mechanical Stress Effects in Scaled MOS Devices," *IEEE Transactions on Electron Devices*, vol. 38, No. 4 (Apr. 1991), pp. 895-900.
Herzog et al., "SiGe-based FETs: buffer issues and device results," Thin Solid Films, vol. 380 (2000) pp. 36-41.
Höck et al., "Carrier mobilities in modulation doped Si1-xGex heterostructures with respect to FET applications," Thin Solid Films, vol. 336 (1998) pp. 141-144.
Höck et al., "High hold mobility in Si0.17 Ge0.83 channel metal-oxide-semiconductor field-effect transistors growth by plasma-enhanced chemical vapor deposition," Applied Physics Letters, vol. 76, No. 26 (Jun. 26, 2000) pp. 3920-3922.

Höck et al., "High performance 0.2 µm p-type Ge/SiGe MODFETs," Electronics Letters, vol. 34, No. 19 (Sep. 17, 1998) pp. 1888-1889.

Huang et al., "Isolation Process Dependence of Channel Mobility in Thin-Film SOI Devices," *IEEE Electron Device Letters*, vol. 17, No. 6 (Jun. 1996), pp. 291-293.

Huang et al., "LOCOS-Induced Stress Effects on Thin-Film SOI Devices," *IEEE Transactions on Electron Devices*, vol. 44, No. 4 (Apr. 1997), pp. 646-650.

Huang, et al., "Reduction of Source/Drain Series Resistance and Its Impact on Device Performance for PMOS Transistors with Raised $Si_{1-x}Ge_x$ Source/Drain", *IEEE Electron Device Letters*, vol. 21, No. 9, (Sep. 2000) pp. 448-450.

Iida et al., "Thermal behavior of residual strain in silicon-on-insulator bonded wafer and effects on electron mobility," *Solid-State Electronics*, vol. 43 (1999), pp. 1117-1120.

International Search Report for PCT/US02/19384, dated Nov. 11, 2002.

International Search Report for PCT/US03/17275, dated Oct. 14, 2003.

International Search Report for PCT/US 03/181123, dated Dec. 1, 2003.

Ismail et al., "Modulation-doped n-type Si/SiGe with inverted interface," Appl. Phys. Lett., vol. 65, No. 10 (Sep. 5, 1994) pp. 1248-1250.

Kearney et al., "The effect of aloy scattering on the mobility of holes in a Sil-xGex quantum well," Semicond. Sci Technol., vol. 13 (1998) pp. 174-180.

Kikkawa et al., "Effect of strained InGaAs step bunching on mobility and device performance in n-InGaP/InGaAs/GaAs pseudomorphic heterostructures grown by metalorganic vapor phase epitaxy," Journal of Crystal Growth, vol. 145 (1994) pp. 799-807.

Kim, "Atomic layer deposition of metal and nitride thin films: Current research efforts and applications for semiconductor device processing," *J. Vac. Sci. Technol. B*, 21(6):2231-2261 (2003).

Koester et al., "Extremely High Transconductance Ge/Si0.4Ge0.6 p-MODFET's Grown by UHV-CVD," IEEE Electron Device Letters, vol. 21, No. 3 (Mar. 2000) pp. 110-112.

König et al., "Design Rules for n-Type SiGe Hetero FETs," Solid State Electronics, vol. 41, No. 10 (1997), pp. 1541-1547.

König et al., "p-Type Ge-Channel MODFET's with High Transconductance Grown on Si Substrates," IEEE Electron Device Letters, vol. 14, No. 4 (Apr. 1993) pp. 205-207.

König et al., "SiGe HBTs and HFETs," Solid-State Electronics, vol. 38, No. 9 (1995) pp. 1595-1602.

Lee et al., "Strained Ge channel p-type metal-oxide-semiconductor field-effect transistors grown on Sil-xGex/Si virtual substrates," Applied Physics Letters, vol. 79, No. 20 (Nov. 12, 2001) pp. 3344-3346.

Lee et al., "Strained Ge channel p-type MOSFETs fabricated on Sil-xGex/Si vitrual substrates," Mat. Res. Soc. Symp. Proc., vol. 686 (2002) pp. A1.9.1-A1.9.5.

Leitz et al., "Channel Engineering of SiGe-Based Heterostructures for High Mobility MOSFETs," Mat. Res. Soc. Symp. Proc., vol. 686 (2002) pp. A3.10.1-A3.10.6.

Leitz et al., "Dislocation glide and blocking kinetics in compositionally graded SiGe/Si," Journal of Applied Phsyics, vol. 90, No. 6 (Sep. 15, 2001) pp. 2730-2736.

Leitz et al., "Hole mobility enhancements in strained Si/Sil-yGey p-type metal-oxide-semiconductor field-effect transistors grown on relaxed Sil-xGex (x<y) vitrual substrates," Applied Physics Letters, vol. 79, No. 25 (Dec. 17, 2001) pp. 4246-4248.

Li et al., "Design of high speed Si/SiGe heterojunction complementary metal-oxide-semiconductor field effect transistors with reduced short-channel effects," J. Vac. Sci. Technol., A 20(3) (May/Jun. 2002) pp. 1030-1033.

Liu et al., "Novel Slidewall Strained-Si Channel nMOSFET," *IEDM* (1999), pp. 63-66.

Maiti et al., "Strained-Si heterostructure field effect transistors," Semicond. Sci. Technol., vol. 13 (1998) pp. 1225-1246.

Meyerson et al., "Cooperative Growth Phenomena in Silicon/Germanium Low-Temperature Epitaxy," Applied Physics Letters, vol. 53, No. 25 (Dec. 19, 1988) pp. 2555-2557.

Meyerson, "UHV/CVD Growth of Si and Si:Ge Alloys: Chemistry, Physics, and Device Applications," *Proceedings of the IEEE*, 80(10):1592-1608 (1992).

Mizuno et al., "Advanced SOI-MOSFETs with Strained-Si Channel for High Speed CMOS Electron/Hole Mobility Enhancement," 2000 Symposium on VLSI Digest of Technology papers (Jun. 13, 2000) pp. 210-211.

Mizuno et al., "Electron and Hole Mobility Enhancement in Strained-Si MOSFET's on SiGe-on-Insulator Substrates Fabricated by SIMOX Technology," IEEE Electron Device Letters, vol. 21, No. 5 (May 2000) pp. 230-232.

Nayak et al., "High Mobility Strained-Si PMOSFET's," IEEE Transactions on Electron Devices, vol. 43, No. 10 (Oct. 1996) pp. 1709-1716.

O'Neill et al., "SiGe Virtual substrate N-channel heterojunction MOSFETS," Semicond. Sci. Technol., vol. 14 (1999) pp. 784-789.

Parker et al., "SiGe heterostructure CMOS circuits and applications," Solid State Electronics, vol. 43, No. 8, (Aug. 1999) pp. 1497-1506.

Pelekanos et al., "Interface roughness correlation in CdTe/CdZnTe strained quantum wells," Journal of Crystal Growth, vol. 184/185 (1998) pp. 886-889. Ransom et al., "Gate-Self-Aligned n-channel and p-channel Germanium MOSFET's," IEEE Transactions on Electron Devices, vol. 38, No. 12 (Dec. 1991) pp. 2695.

Reinking et al., "Fabrication of high-mobility Ge p-channel MOSFETs on Si substrates," Electronics Letters, vol. 35, No. 6 (Mar. 18, 1999) pp. 503-504.

Rim, "Application of Silicon Based Heterostructures to Enhanced Mobility Metal-Oxide-Semiconductor Field-Effect Transistors," Ph.D. Thesis, Stanford University (1999) pp. 1-184.

Rim et al., "Enhanced Hole Mobilities in Surface-Channel Straineed-Si p-MOSFETs," Solid State Electronics Laboratory, Stanford University, CA 94305, pp. 20.3.1-20.3.4.

Rim et al., "Fabrication and Analysis of Deep Submicron Strained-Si N-MOSFET's," IEEE Transactions on Electron Devices, vol. 47, No. 7 (Jul. 2000) pp. 1406-1415.

Robbins et al., "A model for heterogeneous growth of Sil-xGex films for hydrides," Journal of Applied Physics, vol. 69, No. 6 (Mar. 15, 1991) pp. 3729-3732.

Rosenblad et al., "Virtual Substrates for the n- and p-type Si-MODFET Grown at Very High Rates," Materials Science and Engineering, vol. B74 (2000) pp. 113-117.

Sadek et al., "Design of Si/SiGe Heterojunction Complementary Metal-Oxide-Semiconductor Transistors," IEEE Transactions on Electron Devices, vol. 43, No. 8 (Aug. 1996) pp. 1224-1232.

Schäffler, "High-mobility Si and Ge structures," Semicond. Sci. Technol., vol. 12 (1997) pp. 1515-1549.

Shimizu et al., "Local Mechanical-Stress Control (LMC): A New Technique for CMOS-Performance Enhancement," *IEEE International Electron Devices Meeting Technical Digest*, (2001), pp. 433-436.

Srolovitz, "On the Stability of Surfaces of Stressed Solids," Acta metall., vol. 37, No. 2 (1989) pp. 621-625.

Thompson et al., "A Logic Nanotechnology Featuring Strained-Silicon," *IEEE Electron Device Letters*, vol. 25, No. 4 (Apr. 2004), pp. 191-193.

Thompson et al., "A 90 nm Logic Technology Featuring 50nm Strained-Silicon Channel Transistors, 7 layers of Cu *Interconnects*, Low k ILD, and I um$^2$ SRAM Cell," *IEEE International Electron Devices Meeting Technical Digest*, (2002), pp. 61-64.

Tiwari et al., "Hole Mobility Improvement in Silicon-on-Insulator and Bulk Silicon Transistors Using Local Strain," *IEEE International Electron Devices Meeting Technical Digest*, (1997), pp. 939-941.

Tweet et al., "Factors determining the composition of strained GeSi layers grown with disilane and germane," Applied Phsyics Letters, vol. 65, No. 20 (Nov. 14, 1994) pp. 2579-2581.

Uchino, et al., "A Raised Source/Drain Technology Using In-situ P-doped SiGe and B-doped Si for 0.1-µm CMOS ULSIs," *IEEE International Electron Device Meeting Technical Digest*, (1997), pp. 479-482.

Ueno et al., "Low Temperature Buffer Growth for Modulation Doped SiGe/Ge/SiGe Heterostructures with High Hole Mobility," Thin Solid Films, vol. 369 (2000) pp. 320-323.

Usami et al., "Spectroscopic study of Si-based quantum wells with neighboring confinement structure," Semicon. Sci. Technol. (1997) (abstract).

Welser, "The Application of Strained Silicon/Relaxed Silicon Germanium Heterostructures to Metal-Oxide-Semiconductor Field-Effect Transistors," Ph.D. Thesis, Stanford University (1995) pp. 1-205.

Wesler et al., "Electron Mobility Enhancement in Strained-Si N-Type Metal-Oxide-Semiconductor Field-Effect Transistors," IEEE Electron Device Letters, vol. 15, No. 3 (Mar. 1994) pp. 100-102.

Welser et al., "Evidence of Real-Space Hot-Electron Transfer in High Mobility, Strained-Si Multilayer MOSFETs," Electron Devices meetings, 1993. Technical Digest (Dec. 1993) pp. 21.3.1-21.3.4.

Welser et al., "NMOS and PMOS Transistors Fabricated in Strained Silicon/Relaxed Silicon-Germanium Structures," Electron Devices Meeting, 1992. Technical Digest (Dec. 13, 1992) pp. 31.7.1-31.7.3.

Wolf et al., "Silicon Processing for the VLSI Era, vol. 1: Process Technology" (1986) pp. 201. Xie et al., "Semiconductor Surface Roughness: Dependence on Sign and Magnitude of Bulk Strain," The Physical Review Letters, vol. 73, No. 22 (Nov. 28, 1994) pp. 3006-3009.

Xie, "SiGe Field effect transistors," Materials Science and Engineering, vol. 25 (1999) pp. 89-121.

Xie et al., "Very high mobility two-dimenstional hole gas in Si/GexSi1-x/Ge structures grown by molecular beam epitaxy," Appl. Phys. Lett., vol. 63, No. 16 (Oct. 18, 1993) pp. 2263-2264.

Yeo et al., "Enhanced Performance in Sub-100 nm CMOSFETs Using Strained Epitaxial Silicon-Germanium" IEEE, Proceedings of IEDM Conference 2000, Piscataway, NJ, (Dec. 10, 2000) pp. 753-756.

Yousif et al., "Recent Critical Issues in Si/Si1-xGex/Si Heterostructure FET Devices," Solid-State Electronics, vol. 45, No. 11 (2001) pp. 1931-1937.

Examination Report in European Patent Application No. 02734816.8, mailed Jan. 24, 2008, 6 pages.

International Search Report for PCT/US02/19607, dated Oct. 10, 2002.

Ito et al., "Mechanical Stress Effect on Etch-Stop Nitride and Its Impace on Deep Submicron Transistor Design," IEEE IEDM Technical Digest, (2000), pp. 247-250.

Lochefeld, et al., "Investigating the Relationship Between Electron Mobility and Velocity in Deeply Scaled NMOS via Mechnical Stress," IEEE Electron Device Letters, vol. 22, No. 12 (2001), pp. 591-593.

Official Action in Japanese Patent Application No. 2003-519978, 3 pages (Japanese only).

Ootsuka et al., "A Highly Dense, High-Performance 130nm node CMOS Technology for Large Scale System-on-a-Chip Applications," IEEE IEDM Technical Digest, (2000), pp. 575-578.

Ota et al., "Novel Locally Strained Channel Technique for High Performance 55nm CMOS," *IEEE International Electron Device Meeting Technical Digest*, (2002), pp. 27-30.

Öztürk, et al., "Advanced $Si_{1-x}Ge_x$ Source/Drain and Contact Technologies for Sub-70 nm CMOS," *IEEE International Electron Device Meeting Technical Digest*, (2002), pp. 375-378.

Öztürk, et al., "Low Resistivity Nickel Germanosilicide Contacts to Ultra-Shallow $Si_{1-x}Ge_x$ Source/Drain Junctions for Nanoscale CMOS," *IEEE International Electron Device Meeting Technical Digest*, (2003), pp. 497-500.

Öztürk, et al., "Selective Silicon-Gremanium Source/Drain Technology for Nanoscale CMOS," *Mat. Res. Soc. Symp. Proc.*, vol. 717, (2002), pp. C4.1.1-C4.1.12.

Öztürk, et al., "Ultra-Shallow Source/Drain Junctions for Nanoscale CMOS Using Selective Silicon-Germanium Technology," *Extended Abstracts of International Workshop on Junction Technology*, (2001), pp. 77-82.

\* cited by examiner

METHODS OF FABRICATING SEMICONDUCTOR DEVICES HAVING STRAINED DUAL CHANNEL LAYERS

RELATED APPLICATIONS

This application claims benefit of and priority to U.S. application Ser. No. 10/456,926, filed Jun. 6, 2003, which claims the benefit of U.S. Provisional Application Ser. No. 60/386,969, filed Jun. 7, 2002; the entire disclosures of both applications are hereby incorporated by reference.

TECHNICAL FIELD

The invention generally relates to semiconductor devices, and, more particularly, to the fabrication and structure of semiconductor devices that include channels formed in two or more strained layers of different composition.

BACKGROUND INFORMATION

Metal-oxide-semiconductor field-effect transistors (MOSFETs) having a channel formed in strained semiconductor, for example, in strained silicon formed on relaxed $Si_{1-x}Ge_x$, can exhibit improved carrier mobility in comparison to traditional MOSFETs. To provide compatibility with traditional silicon-based fabrication equipment and methods, "virtual substrates," which include a strained semiconductor, can be used in place of conventional silicon wafers.

Virtual substrates based on silicon (Si) and germanium (Ge) provide a platform for new generations of very large scale integration (VLSI) devices that exhibit enhanced performance in comparison to devices fabricated on bulk Si substrates. An important component of a SiGe virtual substrate is a layer of SiGe that has been relaxed to its equilibrium lattice constant (i.e., one that is larger than that of Si.)

The relaxed SiGe layer can be directly applied to a Si substrate (e.g., by wafer bonding or direct epitaxy), or atop a relaxed graded SiGe buffer layer in which the lattice constant of the SiGe material has been increased gradually over the thickness of the layer. The SiGe virtual substrate may also incorporate buried insulating layers, in the manner of a silicon-on-insulator (SOI) wafer.

To fabricate high-performance devices on these platforms, thin strained layers of semiconductors, such as Si, Ge, or SiGe, are grown on the relaxed SiGe virtual substrates. The resulting biaxial tensile or compressive strain alters the carrier mobilities in the grown layers, enabling the fabrication of high-speed and/or low-power-consumption devices.

One technique suitable for fabricating strained Si wafers can include the following steps:

1. Providing a silicon substrate that has been edge polished;
2. Epitaxially depositing a relaxed graded SiGe buffer layer to a final Ge composition on the silicon substrate;
3. Epitaxially depositing a relaxed $Si_{1-x}Ge_x$ cap layer having a constant composition on the graded SiGe buffer layer;
4. Planarizing the $Si_{1-x}Ge_x$ cap layer by, e.g., chemical mechanical polishing (CMP);
5. Epitaxially depositing a relaxed $Si_{1-x}Ge_x$ regrowth layer having a constant composition on the planarized surface of the $Si_{1-x}Ge_x$ cap layer; and
6. Epitaxially depositing a strained silicon layer on the $Si_{1-x}Ge_x$ regrowth layer.

The deposition of the relaxed graded SiGe buffer layer enables engineering of the in-plane lattice constant of the SiGe cap layer (and therefore the amount of strain in the strained silicon layer), while reducing the introduction of dislocations. The lattice constant of SiGe is larger than that of Si, and is a function of the amount of Ge in the SiGe alloy.

As a lattice-mismatched layer (such as a SiGe layer on Si, or a Si channel layer on a relaxed SiGe layer) is deposited, the layer will initially be strained to match the in-plane lattice constant of the underlying silicon substrate. Above a certain critical thickness of the lattice-mismatched layer, however, misfit dislocations form at the layer interface. The layer can relax to its inherent lattice constant due to mismatch accommodation by the misfit dislocations.

The process of relaxation occurs through the formation of the misfit dislocations at the interface between two lattice-mismatched layers. The misfit dislocations accommodate the lattice mismatch at the interface. Moreover, misfit dislocations are associated with bulk lattice dislocations that extend from each end of a misfit dislocation (termed "threading dislocations"). A threading dislocation can rise through the crystal to reach a top surface of the wafer.

A structure that incorporates a compressively strained SiGe layer in tandem with a tensilely strained Si layer can provide enhanced electron and hole mobilities. In this "dual channel layer" structure, electron transport typically occurs within a surface tensilely strained Si channel and hole transport occurs within a compressively strained SiGe layer below the Si layer.

Complementary metal-oxide silicon (CMOS) circuit design is simplified if carrier mobilities are enhanced equally for both NMOS and PMOS devices. In conventional silicon-based devices, electron mobilities are approximately two times greater than hole mobilities. As noted, electron mobilities have been substantially increased with strained silicon. Methods for equally increasing hole and electron mobilities by forming dual-channel NMOS and PMOS devices on the same substrate are problematic, in part because of different surface strained-silicon thickness requirements for the two types of devices.

Moreover, SiGe-based substrates can increase the complexity of device fabrication. For example, the electronic defects and fast diffusion pathways that misfit dislocations can introduce into a substrate can be detrimental for device fabrication and performance. Also, for example, the concentration profile of a Si—SiGe interface can deteriorate due to diffusion that occurs during elevated temperature processing steps. Thus, for example, the desired hole mobility enhancement of a SiGe channel layer can be substantially less than theoretical predictions suggest.

SUMMARY OF THE INVENTION

The invention involves structures and fabrication methods for circuits that include semiconductor devices having a dual channel layer. In some embodiments of the invention, the dual channel layer has layer thicknesses and layer compositions that may optimize electron and hole mobilities in the channel while reducing the presence of misfit dislocations and the related problems they cause. To accomplish this, a SiGe channel layer may be provided with a Ge atomic % concentration approximately 30 percentage points greater than an underlying relaxed substrate SiGe layer, white channel layer thicknesses are near or less than their critical thicknesses that would lead to misfit dislocation formation. The strain level of SiGe channel layers thus produced is approximately 1.2%.

In some embodiments of the invention the surface layer, for example, silicon, of the dual channel layer is deposited to a lesser thickness on regions of a substrate that will be used for PMOS device fabrication. Thus, detrimental effects of the surface layer on PMOS device performance are reduced.

Moreover, process steps directed to removing a portion of the thickness of the surface layer in such regions are not required.

In some embodiments of the invention, the dual channel layer is formed after some or all higher temperature processing steps are completed through use of a temporary dummy gate. Thus, the elemental concentration profile of the channel layers is substantially preserved.

For use in NMOS transistors, the dual channel layer structure preferably includes a silicon layer that overlies and is preferably in contact with a $Si_{1-y}Ge_y$ or germanium layer. The silicon layer preferably is in contact with a gate dielectric. In cases in which the channel layers for NMOS and PMOS transistors are provided separately, the underlying $Si_{1-y}Ge_y$ or germanium layer may be absent for NMOS transistors. For use in PMOS transistors, the dual channel layer structure preferably includes a very thin or absent silicon layer that overlies and is preferably in contact with a $Si_{1-y}Ge_y$ or germanium layer. The silicon layer, if present, preferably is in contact with a gate dielectric. If the silicon layer is absent, the $Si_{1-y}Ge_y$ or germanium layer preferably is in contact with a gate dielectric.

Accordingly, in a first aspect, the invention features a semiconductor structure. The semiconductor structure includes a strain-inducing substrate layer having a germanium concentration of at least 10 atomic %. The semiconductor structure also includes a compressively strained layer on the strain-inducing substrate layer. The compressively strained layer has a germanium concentration at least approximately 30 percentage points greater than the germanium concentration of the strain-inducing substrate layer, and has a thickness less than its critical thickness. The semiconductor structure also includes a tensilely strained layer on the compressively strained layer. The tensilely strained layer may be formed from silicon having a thickness less than its critical thickness.

The compressively strained layer has a strain level of at least approximately 1.2%, and the tensilely strained layer has a strain level of at least approximately 0.4%. The semiconductor structure can be formed on a virtual substrate that includes a buried insulator layer. The strained layers can be disposed over a relaxed strain-inducing substrate layer of at least 10 atomic % which in turn is disposed over the buried insulator layer.

Alternatively, the semiconductor structure can be formed directly on the buried insulator layer by a technique such as wafer bonding. In this case, the strains in the layers are induced by a substrate as described above, the layers are bonded to an insulator layer, and the original strain-inducing layer is removed. In this manner, the desired strain levels are obtained in the layer structure, and the strain is completely maintained by the strong interface with the buried insulator layer. Both the tensilely strained layer and the compressively strained layer may be bonded to the insulator layer together. Alternatively, a single layer may be bonded to the insulator layer, and the other layer may be provided by a technique such as epitaxial growth by chemical vapor deposition.

The structure may further include at least one p-channel component that primarily utilizes the compressively strained layer for a p-channel, and at least one n-channel component that primarily utilizes the tensilely strained layer for a n-channel. The at least one p-channel component may be a p-channel transistor, and the at least one n-channel component may be an n-channel transistor.

In a second aspect, the invention features a method for fabricating a semiconductor structure. The method includes providing a substrate, providing a compressively strained semiconductor on the substrate, depositing a tensilely strained semiconductor adjacent the substrate until a thickness of a first region of the tensilely strained semiconductor is greater than a thickness of a second region of the tensilely strained semiconductor, forming a n-channel device on the first region, and forming a p-channel device on the second region. Thickness of the second region may be sufficiently small such that most of a charge carrier movement in a channel of the p-channel device moves in the compressively strained semiconductor.

The tensilely strained semiconductor may be deposited by forming at least a portion of the thickness of the first region of the tensilely strained semiconductor by depositing a first precursor and reacting a second precursor with the first precursor, whereby the first and second regions are provided with different thicknesses. The precursor deposition steps may be repeated to complete the thickness of the first region.

The tensilely strained semiconductor may be deposited by simultaneously depositing the second region of the tensilely strained semiconductor and an initial portion of the thickness of the first region of the tensilely strained semiconductor. The remainder of the thickness of the first region of the tensilely strained semiconductor may subsequently be deposited.

In a third aspect, the invention features a method for fabricating a semiconductor structure. The method includes providing a substrate comprising a strain-inducing layer, forming a dummy gate structure on the strain-inducing layer, removing the dummy gate to expose a portion of the strain-inducing layer, and depositing a tensilely strained semiconductor adjacent the strain-inducing layer. A compressively strained semiconductor may be deposited before and under the tensilely strained semiconductor to provide a dual channel layer.

Alternatively, a tensilely strained semiconductor may be deposited in conjunction with a first dummy gate structure and a compressively strained semiconductor may be deposited in conjunction with a second gate structure. For example, the first gate structure may support fabrication of a NMOS device and the second may support fabrication of a PMOS device.

The method may include forming a source and a drain in the substrate prior to depositing the compressively strained semiconductor, whereby a concentration profile of the compressively strained semiconductor is effectively preserved. The preserved concentration profile may have an interface abruptness of better than one decade, i.e., an order of magnitude of change of the atomic concentration of a semiconductor species such as Si or Ge, per nanometer of depth. In some implementations, the interface abruptness may be better than two decades per nanometer. Similarly, the method may include forming contacts on the source and drain prior to depositing the compressively strained semiconductor. The method may include a plurality of process steps after depositing the tensilely strained semiconductor and/or compressively strained semiconductor, such that none of the plurality of process steps occurs at temperatures greater than approximately 600° C.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention.

DESCRIPTION

The invention provides improved semiconductor dual channel layer designs and fabrication methods. Various features of the invention are well suited to applications utilizing MOS transistors that include, for example, Si, $Si_{1-x}Ge_x$ and/or Ge layers in and or on a virtual substrate.

The term "MOS" is used in this description to refer generally to semiconductor devices that include a conductive gate spaced at least by an insulating layer from a semiconducting channel layer. The terms "SiGe" and "$Si_{1-x}Ge_x$" are used in this description interchangeably to refer to silicon-germanium alloys. The term "silicide" is used in this description to refer to a reaction product of a metal, silicon, and optionally other components, such as germanium. The term "silicide" is also used, less formally, to refer to the reaction product of a metal with an elemental semiconductor, a compound semiconductor or an alloy semiconductor.

The term "virtual substrate" may refer to a substrate comprising a relaxed strain-inducing semiconductor layer, such as SiGe, or may refer to a substrate comprising an insulator layer which maintains pre-induced strains in subsequently provided layers. The strain levels thus maintained are analogous to those induced by a strain-inducing semiconductor layer. For example, the strain induced by a Ge concentration difference of approximately 30% is approximately 1.2%. A 1.2% strain can also be applied to a strained layer, the layer can be bonded to an insulator layer, and the strain level can be maintained without the presence of the original strain-inducing layer. Thus, language specifying the Ge content of the virtual substrate layer may also apply interchangeably to equivalently strained semiconductor layers disposed over an insulating substrate, where the strain in the semiconductor layers is maintained by the strong interface with the buried insulator layer.

Figure 1:
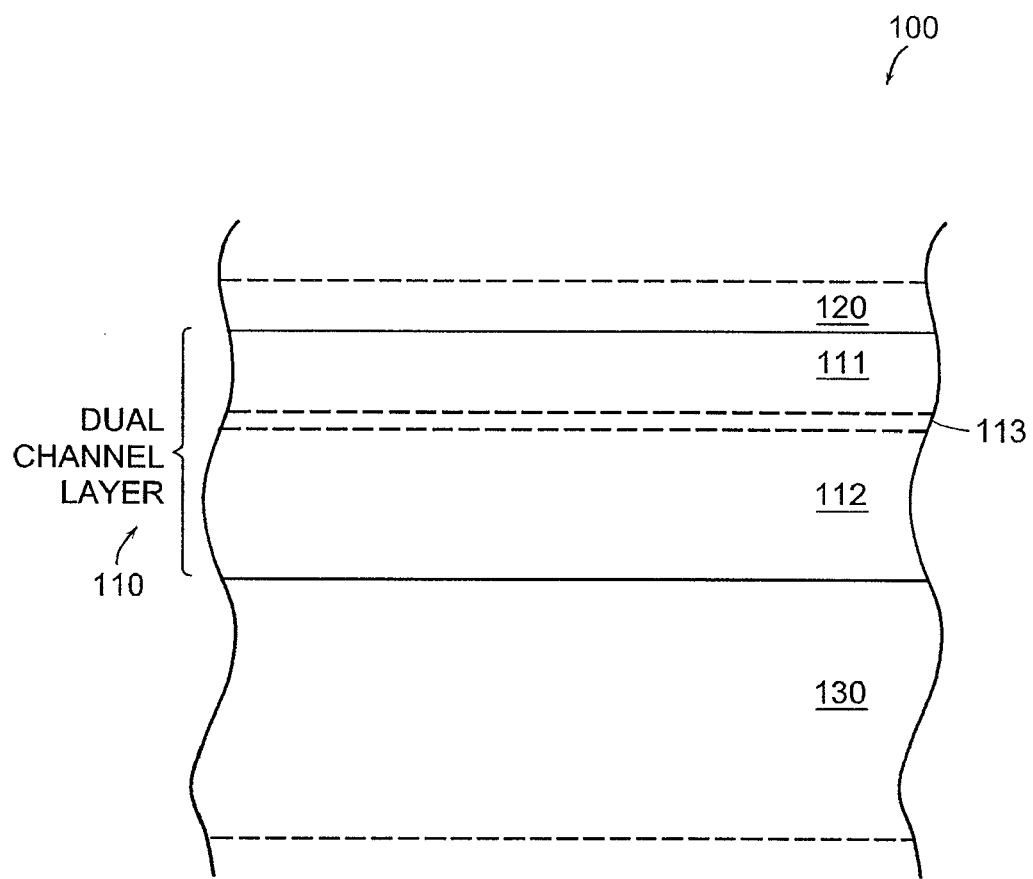
FIG. 1 is cross-sectional view of a portion of an embodiment of a semiconductor structure.

With reference to FIG. 1, some general principles of the invention are described in broad overview. FIG. 1 is a cross-sectional view of a portion of an embodiment of a semiconductor structure 100. The structure 100 includes a dual channel layer 110 and strain-inducing substrate layer 130. The dual channel layer 110 includes a tensilely strained layer 111 and a compressively strained layer 112. The structure can include one or more devices, such as MOSFETs as described with reference to see FIGS. 3 and 4, which can share the dual channel layer 110.

As described in more detail below, the dual channel layer 110, in various implementations of the invention, has preferred layer thicknesses, preferred layer compositions, and/or preferred fabrication process steps. A shared dual channel layer 110 can be continuous or discontinuous depending on the fabrication steps of the particular implementation of the invention. I.e., the shared dual channel layer 110 can optionally extend continuously between two or more devices, or individual devices may be associated with spaced portions of the dual channel layer 110. The various implementations of the invention can optimize improved electron and hole mobilities in a dual channel while reducing the presence of heterojunction misfit dislocations.

The channel layer 110 may include one or more intermediate layers 113, though preferably the compressively strained layer 112 and the tensilely strained layer 111 are in contact with each other. Further, the tensilely strained layer 111 is preferably in contact with a dielectric layer 120, which can serve as a gate dielectric. Optionally, dielectric layer 120 may be in contact with compressively strained layer 112 in some regions, i.e., the tensilely strained layer 111 may be thinner or absent in some portions of the structure 100.

The channel layer 110 is in contact with the underlying strain-inducing substrate layer 130. The strain-inducing substrate layer 130, such as a relaxed SiGe layer, can control, in part, the level of strain in the compressively strained layer 112 and the tensilely strained layer 111.

Figure 2:
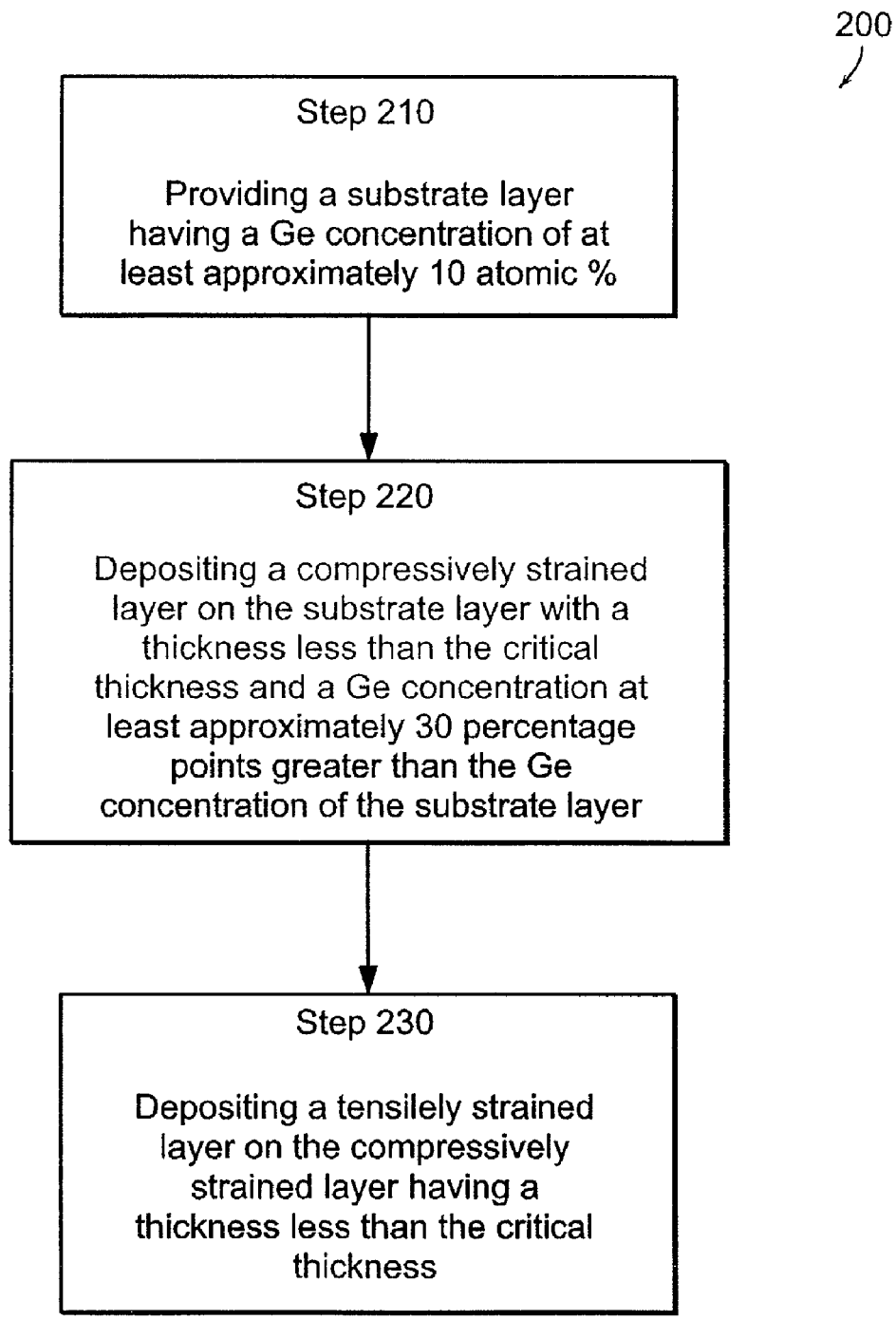
FIG. 2 is a flowchart of an embodiment of a method for fabricating a semiconductor structure.

With reference to FIG. 2, dual channel layer fabrication according to some principles of the invention are described in broad overview. FIG. 2 is a flowchart of an embodiment of a method 200 for fabricating a semiconductor structure. The method 200 may be utilized to fabricate the structure 100. Although dual channel layers may be formed from a variety of semiconductor materials, the descriptions provided herein will focus on implementations that utilize silicon, germanium, and SiGe.

The method 200 includes providing a strain-inducing substrate layer (Step 210), such as the layer 130, depositing a compressively strained layer (Step 220), such as the layer 112, on the strain-inducing substrate layer, and depositing a tensilely strained layer (Step 230), such as the layer 111, on the compressively strained layer. The substrate layer is formed of SiGe having a germanium concentration of at least approximately 10 atomic %. The substrate layer may be a relaxed SiGe layer of a virtual substrate. The concentration of Ge is chosen to provide a satisfactory amount of electron mobility enhancement in an overlying channel layer, for example, the tensilely strained layer 111.

Deposition may be accomplished, for example, by any suitable epitaxial deposition system, including, but not limited to, atmospheric-pressure CVD (APCVD), low- (or reduced-) pressure CVD (LPCVD), ultra-high-vacuum CVD (UHVCVD), or by molecular beam epitaxy. The epitaxial growth system may be a single-wafer or multiple-wafer batch reactor. The growth system also may utilize a low-energy plasma to enhance the layer growth kinetics.

The compressively strained layer is formed from SiGe with a germanium concentration of at least approximately 30 percentage points greater than the germanium concentration of the strain-inducing substrate layer. The germanium concentration differential between the compressively strained layer and the strain-inducing substrate layer is chosen to provide a satisfactory level of hole mobility in the compressively strained layer. In various alternative implementations, the germanium concentration is: at least approximately 35 percentage points greater; at least approximately 40 percentage points greater; at least approximately 45 percentage points greater; at least approximately 50 percentage points greater; or at least approximately 55 percentage points greater.

Further, the compressively strained layer is deposited to a thickness less than that which would cause significant formation of misfit dislocations at the heterojunction interface between the compressively strained layer and the strain-inducing substrate layer. Thus, the thickness of the compressively strained layer may be chosen to be near or less than its critical thickness. As known to one having ordinary skill in the semiconductor deposition arts, the critical thickness of a SiGe film grown on a SiGe layer is in part a function of the compressive stress applied to the SiGe film by the underlying SiGe layer. I.e., the critical thickness of the SiGe film is a function of both the germanium concentration of the SiGe film and the germanium concentration of the SiGe layer.

As known to one having ordinary skill, the critical thickness can be theoretically calculated. It is preferable, however, to determine the critical thickness of a layer via experimental means. For example, a SiGe layer having 50 atomic % Ge grown on a relaxed SiGe substrate having 20 atomic % Ge has a theoretic critical thickness of approximately 8 nm, but experimentally will exhibit a critical thickness in a range of approximately 5 nm to 10 nm. For example, a Si layer grown on a relaxed SiGe substrate having 20 atomic % Ge has a theoretic critical thickness of approximately 13 nm, but experimentally will exhibit a critical thickness in a range of approximately 11 nm to 16 nm.

The tensilely strained layer may be formed of silicon. As for the compressively strained layer, the tensilely strained layer is deposited until its thickness is less than that which would lead to significant formation of misfit dislocations at the heterojunction interface between the tensilely strained layer and the compressively strained layer (e.g., an experimentally determined thickness in a range of approximately 11 nm to 16 nm when grown adjacent to a strain-inducing substrate layer having 20 atomic % Ge, as described in the previous paragraph.) Thus, the thickness of the tensilely strained layer is near to or less than its critical thickness, as controlled in part by the stress imposed on the tensilely strained layer due to the presence of the underlying strain-inducing substrate layer.

Alternatively, after the steps of method 200, the dual channel layer 110 may be bonded to an insulator, after which the strain-inducing substrate layer is removed. The strain levels in the layers are maintained via the bonding to the insulator.

The magnitude of strain in a strained layer may be estimated as follows. The lattice spacing of Ge is approximately 4% greater than the lattice spacing of Si. Therefore, a thin layer of silicon strained by a thick Ge substrate layer has a strain of approximately 4%. Similarly, the strain of a strained layer may be estimated by multiplying 4% by the difference in Ge concentration between the strained layer and an underlying layer. Thus, for example, a strained layer having 70% Ge has a strain of approximately 2% when grown on a substrate layer having 20% Ge.

Table I lists some preferred values and ranges of values of germanium concentration and layer thicknesses for the above-described layers in a semiconductor structure (concentration in atomic % and thickness in nanometers.) These values provide an effective level of electron and hole mobility enhancement and a reduction of misfit dislocation density. The specific values listed should not be construed as limiting the bounds of various implementations of the invention, so long as principles of the invention are fulfilled.

TABLE I

|  | preferred thickness | preferred Ge concentration |
|---|---|---|
| tensile layer | 5 to 35 | 0 |
| tensile layer | 12 to 20 | 0 |
| compressive layer | 3 to 15 | ≧ (substrate layer + 30) |

TABLE I-continued

|  | preferred thickness | preferred Ge concentration |
|---|---|---|
| compressive layer | 3 to 8 | ≧ (substrate layer + 50) |
| substrate layer |  | 10 to 30 |
| substrate layer |  | 15 to 20 |

Referring again to FIG. 1, in one implementation of the structure 100, the tensilely strained layer 111 is a silicon layer under a tensile strain, the compressively strained layer 112 is a germanium or $Si_{1-y}Ge_y$ layer under a compressive strain, and the compressively strained layer 112 is in contact with the strain-inducing substrate layer 130.

The strain-inducing substrate layer 130 includes a relaxed $Si_{1-x}Ge_x$ layer having a lower concentration of germanium than that of the compressively strained layer 112. Thus, strain in the tensilely strained layer 111 is largely determined by the concentration of germanium in the relaxed $Si_{1-x}Ge_x$ layer, while the strain in the compressively strained layer 112 is largely determined by the difference in germanium concentration between the compressively strained layer 112 and the relaxed $Si_{1-x}Ge_x$ strain-inducing substrate layer 130.

The tensilely strained layer 111 preferably has a thickness minimally sufficient to support electron conduction, that is, to provide an n-channel for one or more NMOS components. For a silicon layer of the presently described implementation, the silicon thickness is approximately 5 nm.

For silicon thicknesses less than approximately 4 nm, some loss of electron mobility will generally occur. Hole mobility in the dual channel layer 110, however, generally benefits from use of a tensilely strained layer 111 having a lesser thickness. Moreover, a PMOS device may benefit by minimizing the thickness of the tensilely strained layer 111. For example, in the region of a PMOS device the dual channel layer 110 may be provided with a silicon tensile layer of less than 5 nm. The silicon tensile layer still has a sufficient thickness to provide a good interface with a gate dielectric material. In some embodiments, in the region of a PMOS device the dual channel layer 110 may be provided without a silicon tensile layer, and a gate dielectric material forms a good interface with the compressively strained layer 112. The gate dielectric material may comprise a high-k material with a higher dielectric constant than that of silicon dioxide, for example SiON, $HfO_2$, $ZrO_2$, $La_2O_3$, or $Al_2O_3$.

The channel layer 110 provides enhanced hole mobility, in part provided by the compressively strained germanium or $Si_{1-y}Ge_y$ layer. The compressively strained layer 112, in this implementation, has a band-gap offset relative to both the tensilely strained layer 111 and the relaxed SiGe strain-inducing substrate layer, which can promote confinement of an extended hole wave function within the compressively strained layer 112. This effect can further promote enhanced hole mobility for a p-channel component in the structure 100.

The above-described implementation provides enhanced hole mobility via a number of means. For example, a compressively strained $Si_{1-y}Ge_y$ layer has a greater hole mobility than an unstrained $Si_{1-y}Ge_y$ layer. A greater Ge concentration can also enhance hole mobility.

Further, reduction or elimination of misfit dislocations by selection of layer thicknesses that are less than the respective layer critical thickness provides benefits beyond that of mobility enhancement. For example, electronic defects and enhanced diffusion pathways may be greatly reduced, thus improving manufacturability and device performance.

An implementation of the invention having a compressively strained layer 112 of germanium can lead to stresses in a tensilely strained layer 111 of silicon that will lead to partial or complete relaxation of the silicon via dislocation formation. A pure germanium compressively strained layer 112 is preferably formed on a strain-inducing substrate layer 130 having a relatively high concentration of germanium; the high concentration strain-inducing substrate layer 130 will generally have a relatively very high lattice mismatch relative to the silicon of the tensilely strained layer 111. Thus, the tensilely strained layer 111 is subjected to a high tensile stress.

Reduction in the concentration of germanium in the strain-inducing substrate layer 130 and related reduction in the concentration of germanium in the compressively strained layer 112 can substantially reduce or eliminate relaxation of the tensilely strained layer 111 while preserving desirable layer thicknesses. Thus, a desirable level of tensile stress in the tensilely strained layer 111 can be maintained.

For example, a strain-inducing substrate layer 130 of relaxed SiGe having a composition of approximately 20 atomic % Ge can be used in combination with a compressively strained layer 112 having a composition in a range of approximately 50 atomic % Ge to approximately 80 atomic % germanium. Reduced stress in a silicon tensilely strained layer 111 having a sub-critical thickness can then preserve the benefits of a tensilely strained silicon layer.

As another alternative, the tensilely strained layer 111 can be reduced in thickness when used in combination with a strain-inducing substrate layer 130 having a relatively large lattice mismatch that will cause a correspondingly large stress in the tensilely strained layer 111. Thus, some thickness of the tensilely strained layer 111 can be sacrificed to preserve a tensile strain in the tensilely strained layer 111, i.e., by reducing or eliminating the density of misfit dislocations.

Figure 3:
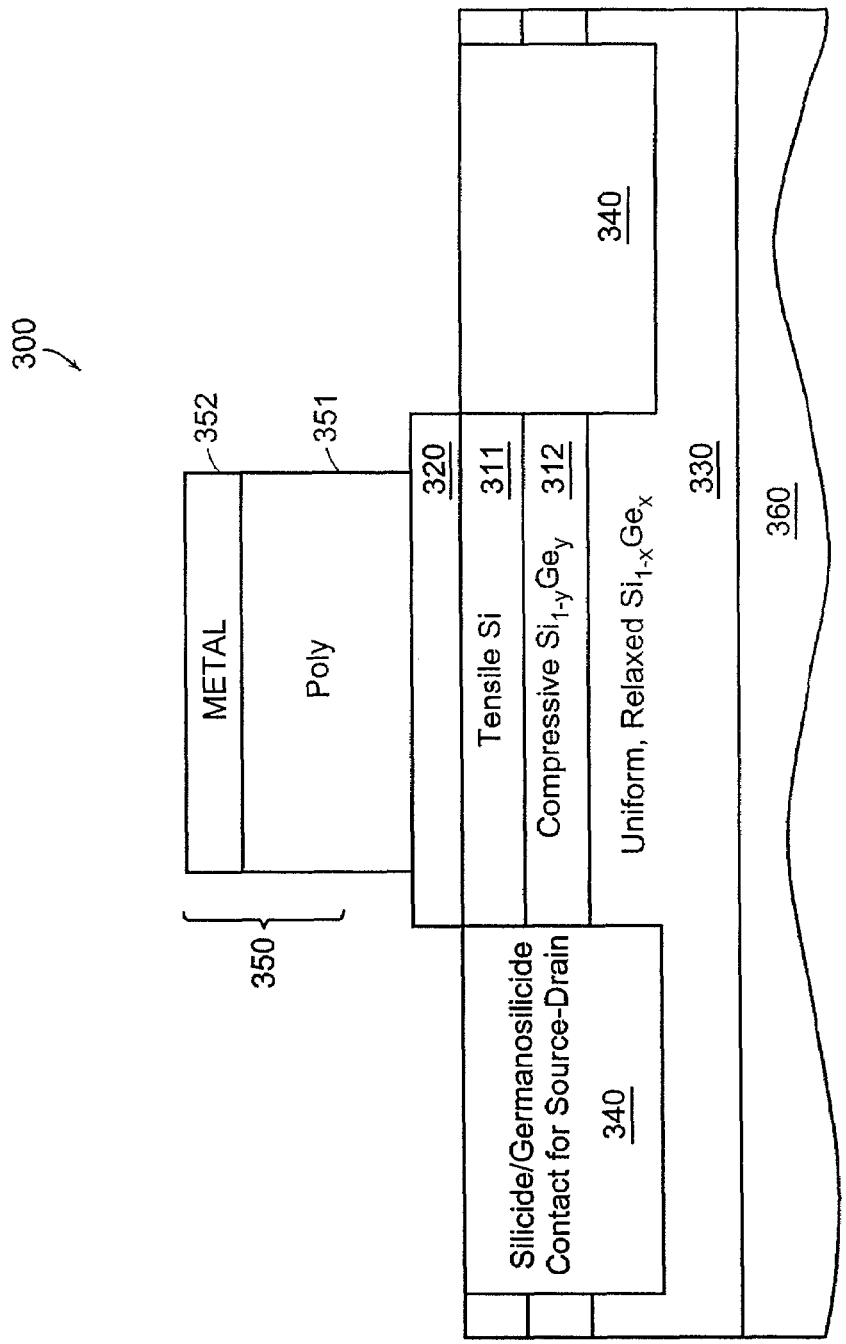
FIG. 3 is a cross-sectional view of an embodiment of a transistor.
Figure 4:
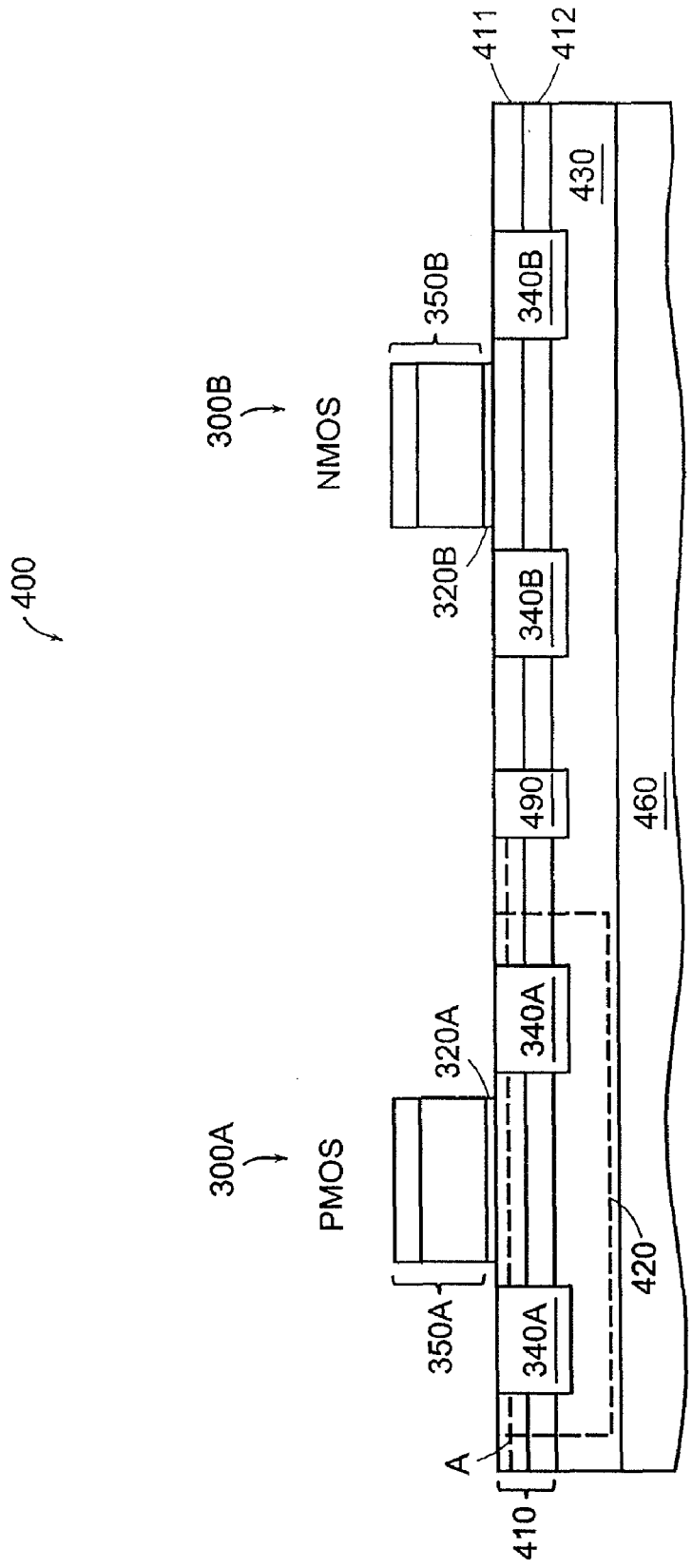
FIG. 4 is a cross-sectional view of an embodiment of a structure that includes a PMOS transistor and a NMOS transistor.

Referring to FIGS. 3 and 4, the dual channel layer 110 may provide both an n-channel for at least one NMOS component and a p-channel for at least one PMOS component. The components may be MOS transistors, for example, NMOS and PMOS transistors in an inverter. As described above, the channel layer 110 provides a dual channel via appropriate selection, in part, of layer thicknesses and compositions.

FIG. 3 is a cross-sectional view of an embodiment of a transistor 300 that can be included in a structure, such as the structure 100, according to principles of the invention. The transistor 300 includes a gate contact 350, source and drain silicide contacts 340, a gate oxide layer 320, a dual channel layer (optionally shared with other components in the structure) including a tensilely strained silicon layer 311 and a compressively strained $Si_{1-y}Ge_y$ layer 312, a strain-inducing relaxed $Si_{1-x}Ge_x$ substrate layer 330, and a silicon substrate 360. Alternatively, a dielectric layer may be present below instead of the strain-inducing relaxed $Si_{1-x}Ge_x$ substrate layer 330. The gate contact 350 can include a doped conductive polycrystalline silicon ("polysilicon") lower portion 351 proximal to the gate oxide 320 and a gate silicide upper portion 352. Alternatively, the gate contact 350 may be formed of another conductive material, such as a doped semiconductor, e.g., polycrystalline SiGe; a metal, e.g., titanium (Ti), tungsten (W), molybdenum (Mo), tantalum (Ta), or iridium (Ir); or metal compounds that provide an appropriate workfunction, e.g., titanium nitride (TiN), titanium silicon nitride (TiSiN), tungsten nitride (WN), tantalum nitride (TaN), tantalum silicide (TaSi), nickel silicide (NiSi), or iridium oxide ($IrO_2$).

The tensilely strained silicon layer 311 and the compressively strained $Si_{1-y}Ge_y$ layer 312 may be epitaxially grown on the relaxed $Si_{1-x}Ge_x$ layer 330. The source and drain contacts 340 can be formed, for example, by depositing a metal layer and reacting the metal layer with the channel layer and the relaxed SiGe layer 360.

The gate oxide 320 is formed on the silicon tensilely strained layer 311, in some embodiments consuming a portion of the surface of the strained silicon. The dielectric layer 320 can be formed by various methods conventional in the art, e.g., thermal oxidation or a deposition technique.

The gate oxide 320 can be, for example, a 1.0 to 10.0 nm thick layer of silicon dioxide. Other embodiments include other suitable dielectric materials, e.g., silicon oxynitride, silicon nitride, a plurality of silicon nitride and silicon oxide layers, or a high-k dielectric. Alternative dielectric materials may be employed when, for example, a thin effective gate oxide thickness is desired, for example, equivalent to an $SiO_2$ layer thickness of 2.0 nm or less.

The transistor 300, according to principles of the invention, can be implemented as a NMOS or a PMOS component. The transistor 300 can include, for example, different doping types and levels in the source, drain, and channel layer regions. A structure can thus include NMOS and PMOS transistors 300, utilizing a common dual channel layer, and both NMOS and PMOS components can provide improved channel performance.

Referring now to FIG. 4, features of the invention are described that permit different as-deposited dual channel layer thicknesses for p-channel and n-channel devices. FIG. 4 is a cross-sectional view of an embodiment of a structure 400 that includes a PMOS transistor 300A and a NMOS transistor 300B. The transistors 300A, 300B have structures and compositions similar to those of the embodiment described with respect to FIG. 3. A dual channel layer shared by each of the transistors, however, may have a different as-deposited thickness of the tensilely strained material for the different transistor types, i.e., PMOS versus NMOS. For one transistor type, the tensilely strained material may be absent, e.g., in a PMOS device. For one transistor type, the compressively strained material may be absent, e.g., in an NMOS device.

The transistors 300A, 300B include gate contacts 350A, 350B, source and drain silicide contacts 340A, 340B, and gate oxide portions 320A, 320B. The transistors 300A, 300B share a dual channel layer 410 that optionally includes a $Si_{1-y}Ge_y$ compressively strained layer 412 and/or a silicon tensilely strained layer 411. The structure 400 also includes a $Si_{1-x}Ge_x$ relaxed strain-inducing substrate layer 430 and a silicon substrate 460.

The structure 400 includes an n-type implanted dopant well 420, within which the PMOS transistor 300A resides. The dopant well 420 can be formed via any of a variety of methods known in the semiconductor fabrication arts. The transistors 300A, 300B are electrically isolated from each other via a shallow trench isolation (STI) portion 490.

The portion 490 preferably is deep enough to cross the dual channel layer 410, ending at least in the SiGe relaxed strain-inducing substrate layer 430. In other embodiments, the portion 490 is absent or replaced by other isolation means. For example, one embodiment includes semi-recessed oxide isolation (S-ROX) portions.

In one embodiment of the structure 400, the as-deposited silicon tensilely strained layer 411 in the region of the PMOS transistor 300A is thinner than in the region of the NMOS transistor 300B. The thinner region of the silicon tensilely strained layer 411 in this implementation is indicated by the dashed line A in FIG. 4. This implementation can provide a further enhancement of the hole mobility in the channel layer 410 for the PMOS transistor 300A, and can reduce undesirable effects of a thicker tensile layer in the dual channel layer in the region of the PMOS transistor. In some implementations, the tensile layer 411 is thinner or absent in the PMOS transistor 300A. In some implementations, the compressively strained $Si_{1-y}Ge_y$ layer 412 may be absent for NMOS transistors.

Figure 5:
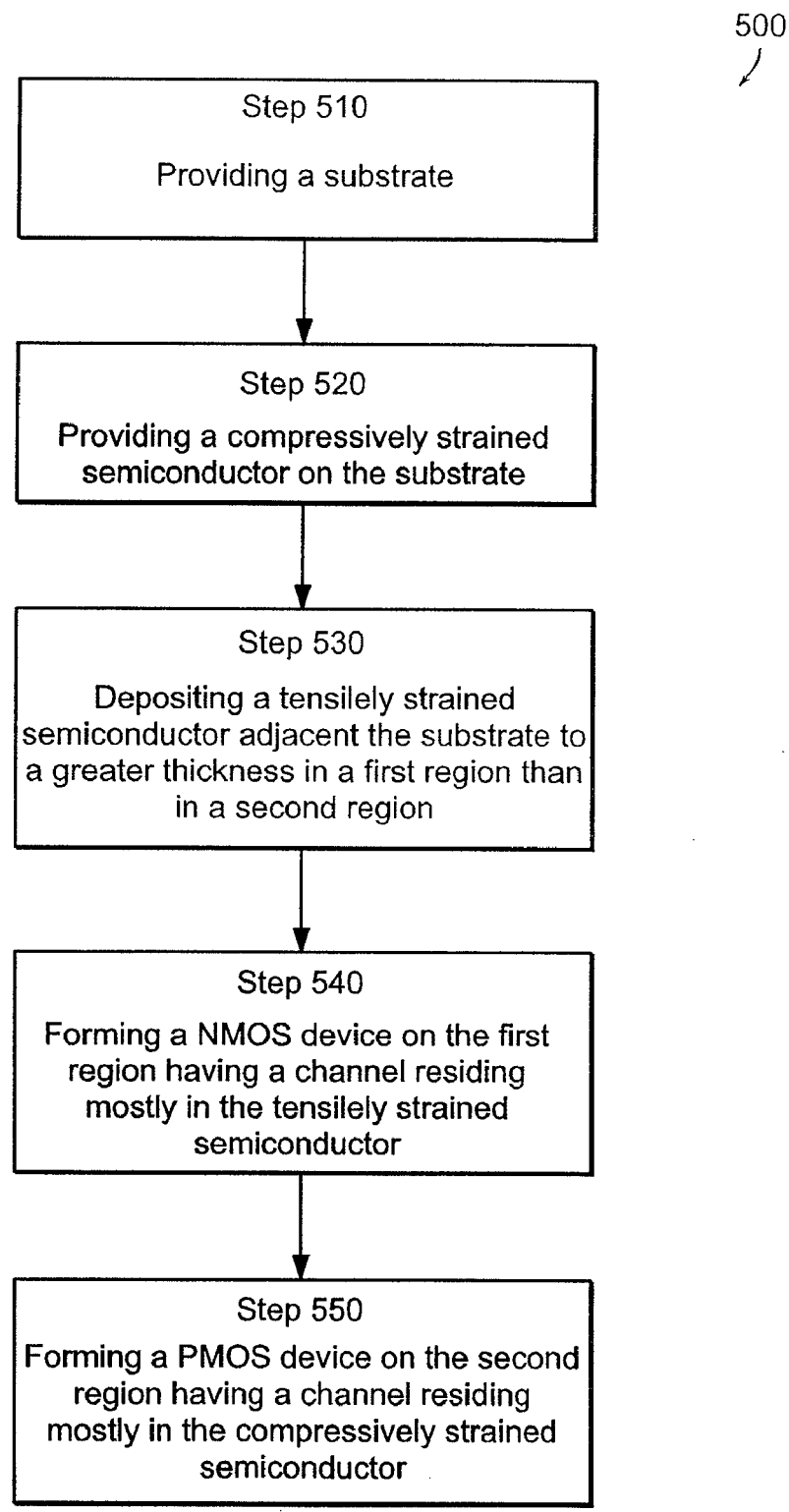
FIG. 5 is a flowchart of an embodiment of a method for fabricating a semiconductor structure.

FIG. 5 is a flowchart of an embodiment of a method 500 for fabricating a semiconductor structure, such as the implementation of the structure 400 in which the dual channel layer is thinner in the region of one or more PMOS devices. The method 500 may also be utilized to fabricate the structure 100.

The method 500 includes providing a substrate (Step 510), for example, a substrate that includes the strain-inducing the layer 130. A compressively strained semiconductor is provided on the substrate (Step 520) and a tensilely strained semiconductor is deposited adjacent to the substrate (Step 530). A n-channel device is formed on the first region (Step 540), and a p-channel device is formed on the second region (Step 550).

The tensilely strained semiconductor is deposited until the tensilely strained semiconductor has a first thickness in a first region and a second thickness in a second region. The thickness in the first region of the tensilely strained semiconductor is greater than the thickness of the second region of the tensilely strained semiconductor. Thus, the compressively strained semiconductor and the tensilely strained semiconductor provide a dual channel layer having regions of different tensile semiconductor thickness. The different regions can be optimized for the different requirements of NMOS and PMOS devices. In one embodiment, the tensilely strained semiconductor is absent in the second region and deposited only in the first region.

The n-channel device formed on the first region primarily utilizes the tensilely strained semiconductor for the n-channel, and the p-channel device formed on the second region that primarily utilizes the compressively strained semiconductor for the p-channel. By depositing the tensilely strained semiconductor until it has desired thicknesses in different regions, fabrication of a semiconductor structure can be simplified. In particular, process steps directed at thinning of the tensilely strained semiconductor in selected regions can be avoided.

Any of several deposition methods may serve for deposition of a tensilely strained semiconductor of different desired thicknesses in different regions. One preferred deposition method is Atomic Layer Deposition (ALD). The general principles of ALD are known to one having ordinary skill in the semiconductor deposition arts. In one suitable implementation of ALD, a precursor material is first deposited in a region selected for film growth. The precursor material is then exposed to a second precursor material that reacts with the first precursor to give the desired material product, for example, silicon or SiGe. Other possible deposition methods are, for example, APCVD, LPCVD, UHVCVD, or molecular beam epitaxy.

Multiple cycles of application of the first and second precursors may then provide a film of a desired thickness. Different regions of the substrate may be selectively subjected to different numbers of deposition cycles to obtain regions of tensilely strained semiconductor of different desired thicknesses.

Figure 6:
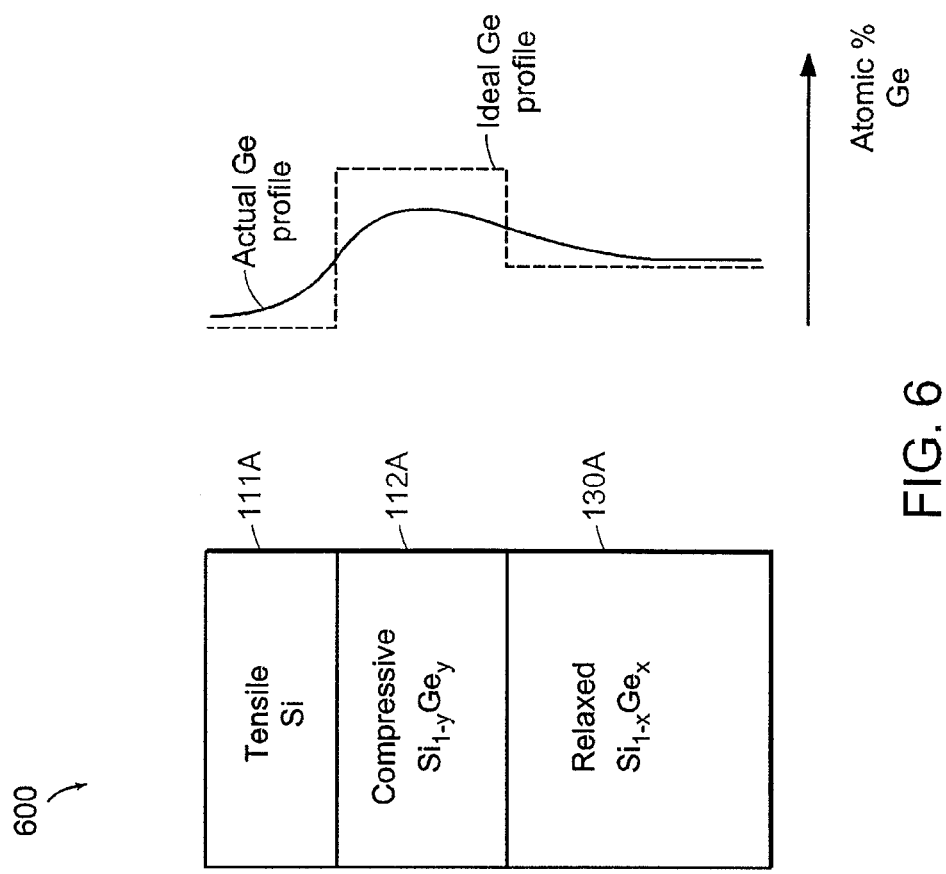
FIG. 6 is a cross-sectional view of a portion of a device embodiment having a dual channel layer and the corresponding theoretical and post-processing germanium concentration profiles in the dual channel layer.

Referring to FIG. 6, FIG. 7 and FIGS. 8a through 8b, some fabrication methods, according to principles of the invention, provide improved germanium concentration profiles in a dual channel layer by reducing the exposure of the dual channel layer to elevated temperature process steps. FIG. 6 shows a cross-sectional portion of a device 600 having a dual channel layer and corresponding theoretical and actual post-processing germanium concentration profiles in the dual channel layer. The profiles illustrate the evolution of a germanium concentration profile when features of the invention that help to preserve the profile are not employed.

The dual channel layer includes a tensile silicon layer 111A, a compressive SiGe layer 112A, and a relaxed SiGe layer 130A. The dashed line illustrates an ideal germanium concentration profile of the layers 111A, 112A, 130A. As shown, the compressive SiGe layer 112A has a greater germanium concentration than the neighboring layers 111A, 130A, and abrupt concentration changes occur at the layer interfaces.

An illustrative germanium concentration profile as obtained after conventional processing is illustrated by the solid line curve. The germanium concentration varies gradually across the interfaces, rather than abruptly. The gradual variation arises due to diffusion that occurs during processing steps having an elevated temperature, in particular, those steps that occur above approximately 700° C. Referring to FIG. 7 and FIGS. 8a to 8d, aspects of the invention that provide reduced blurring of heterojunction interfaces are described. In accordance with these aspects of the invention, the abruptness of the interfaces between layers 111A, 112A, and 130A can be greater than approximately one decade per nanometer. In another embodiment, the interface abruptnesses are maintained at greater than approximately two decades per nanometer.

Figure 7:
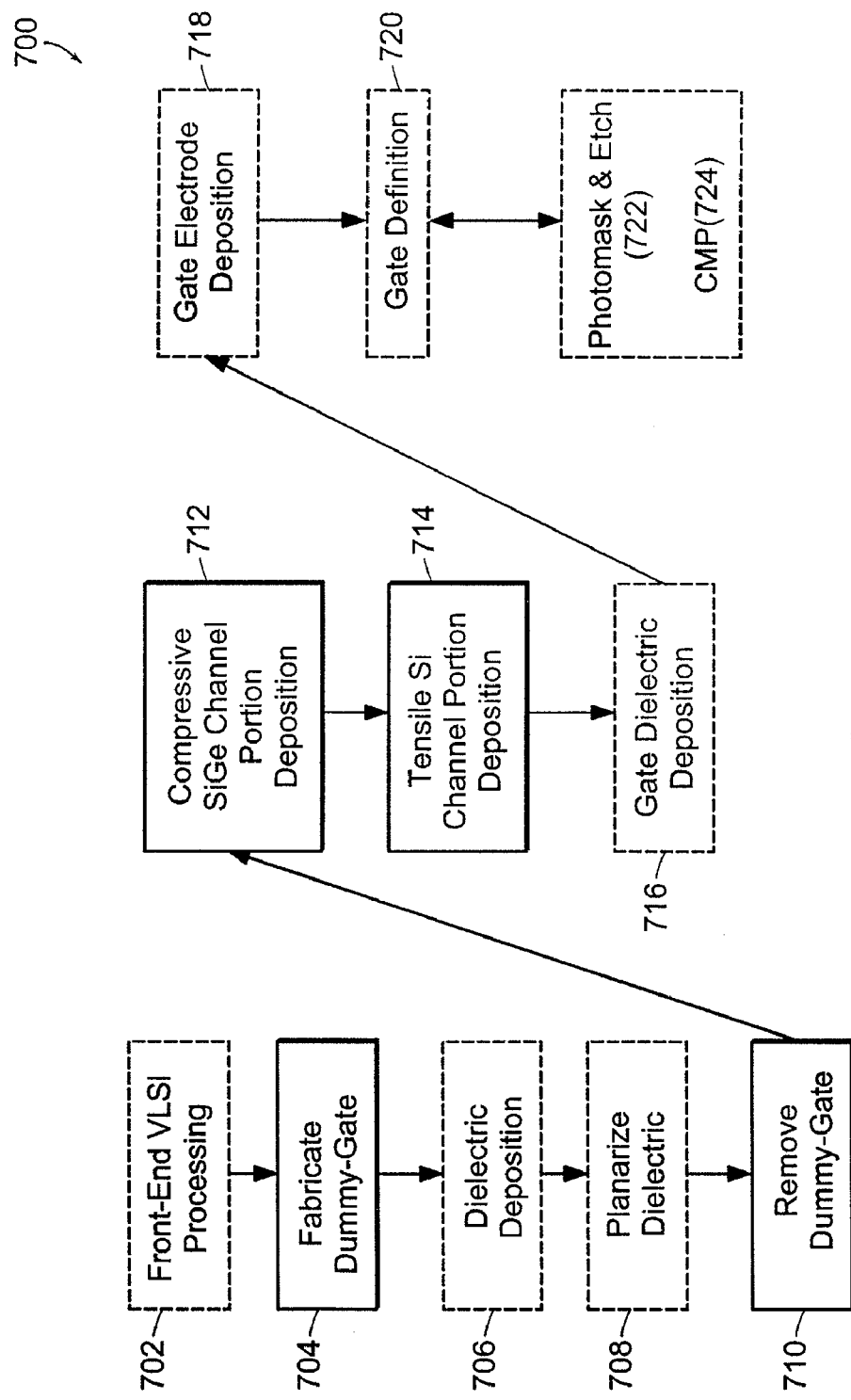
FIG. 7 is a flowchart of an embodiment of a method for fabricating a semiconductor structure.

FIG. 7 is a flowchart of a method 700 for fabricating a semiconductor structure in accordance with an embodiment of the invention. The method 700 entails creation of a dual channel layer at a stage in the fabrication process that reduces exposure to elevated temperatures, in comparison to conventional fabrication methods. The method 700 includes front-end VLSI processing steps (Step 702), "dummy gate" fabrication (Step 704), dielectric layer deposition (Step 706) and planarization (Step 708), removal of the dummy gate (Step 710), strained channel layer deposition (Steps 712, 714), gate dielectric formation (Step 716), deposition of gate electrode material (Step 718), gate electrode definition (Step 720). The gate electrode may be defined via photomasking and etching (Step 722) of the gate electrode material. Gate electrode definition may include a CMP step (Step 724).

The method 700 commences with traditional front-end VLSI processing steps, such as, for example, well formation and isolation (Step 702). After Step 702, a "dummy gate" is fabricated (Step 704) in place of the ultimately desired gate electrode. As described below, the dummy gate is etched and replaced after some high temperature processing steps. The dummy gate may include an insulating material such as $Si_3N_4$ or other dielectric material, or a conducting material such as polysilicon, poly-Ge, or metal. After dummy gate formation and definition, other front-end processing steps such as spacer formation, source-drain implant, and silicidation may occur.

In contrast to a typical MOSFET process in which the gate is separated from the semiconductor substrate by a gate dielectric, the dummy gate is separated from the substrate by an etch-stop layer. The etch-stop layer can be formed of $SiO_2$, either thermally grown or deposited, or another suitable material which allows the selective removal of the dummy gate material.

Next, a dielectric layer may be deposited (e.g., by a CVD process) (Step 706) and planarized (Step 708) by, for example, chemical mechanical polishing (CMP). This planarized dielectric layer is typically formed from a different material then the dummy gate.

Next, the dummy gate is removed by a selective etching process (Step 710). The etch-stop layer protects the substrate from this etching process. A wet or dry etch then removes the etch-stop layer.

An example configuration includes a polysilicon dummy gate, an $SiO_2$ etch-stop layer, $Si_3N_4$ spacers, and an $SiO_2$ planarization layer. This configuration allows selective removal of the dummy gate with an etchant such as heated tetramethylammonium hydroxide ("TMAH"), thereby leaving the $SiO_2$ and $Si_3N_4$ intact. The etch-stop is subsequently removed by a wet or dry etch (e.g., by HF).

Next, the strained channel layers are deposited, for example, by a chemical vapor deposition (CVD) process (Steps 712, 714). As described above, the dual channel layers may be formed from Si, Ge, and SiGe. The gate dielectric is then thermally grown or deposited, for example, by CVD, ALD, or oxidation (Step 716). Deposition of the gate electrode material follows (Step 718), which can include, for example, doped or undoped polysilicon, doped or undoped poly-SiGe, or metal. Since only the substrate portion formerly covered by the dummy gate and etch stop is exposed, the dual channel layers, gate dielectric, and gate electrode materials are only provided in this portion (between the spacers formed earlier). In one alternative embodiment, the dual channel layer includes only a compressively strained layer, for example for a PMOS device. In another alternative embodiment, the dual channel layer includes only a tensilely strained layer, for example for an NMOS device.

During the deposition of the gate electrode material, the gate electrode material may also be deposited on top of the planarized dielectric layer provided in Steps 706 and 708. In this case, the gate electrode is subsequently defined (Step 720). The gate electrode may be defined by photomasking and etching (Step 722) of the gate electrode material. Alternatively, gate electrode definition may include a CMP step (Step 724), where the gate electrode material above the planarization layer is removed.

The method 700 permits high temperature processing steps, such as silicide formation or dopant activation annealing, to occur prior to the deposition of the strained channel layers (Steps 712, 714). All processing steps subsequent to the deposition of the strained channel layers may be limited to temperatures that have a relatively small impact on the Ge concentration profile in the channel layers (for example, a highest subsequent processing temperature of approximately 600° C., for oxide formation.)

Figure 8A:
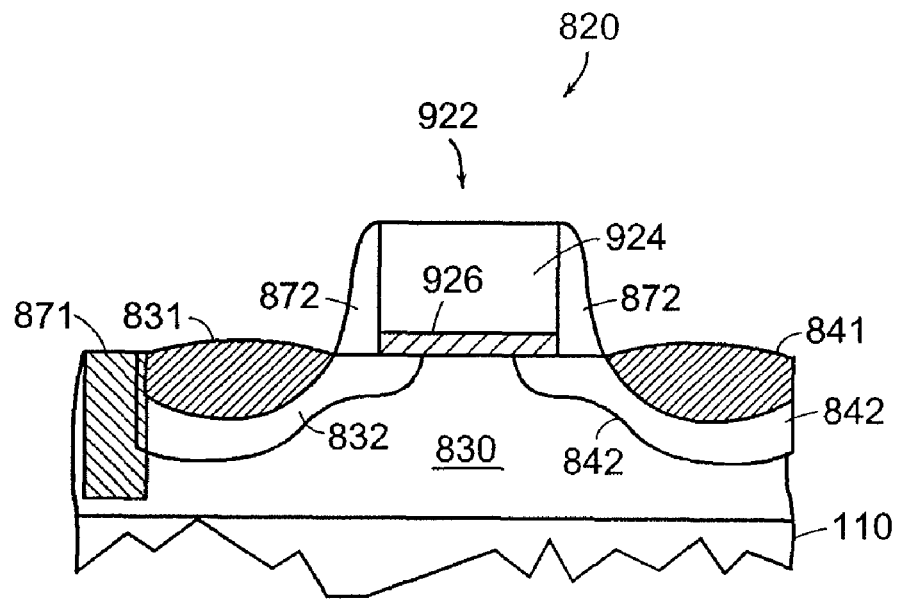
FIGS. 8a through 8d are cross-sectional views of an embodiment of a MOSFET at various stages of fabrication associated with the method illustrated in FIG. 7.
Figure 8B:
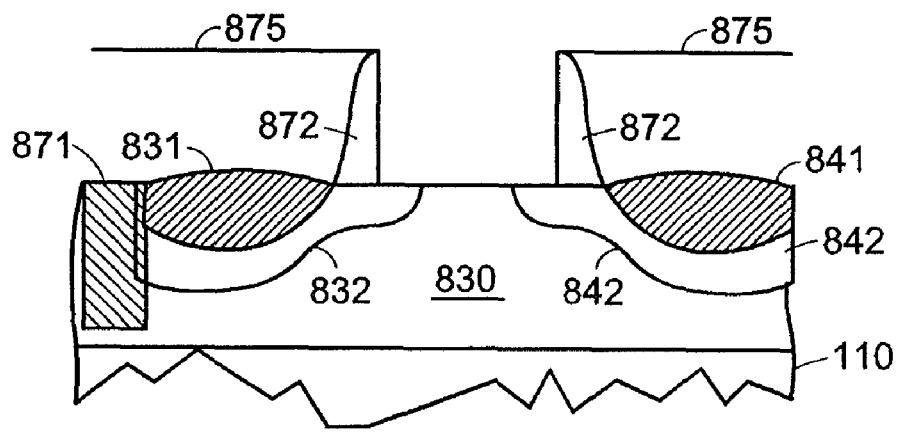

FIGS. 8a through 8b are cross-sectional views of an embodiment of a MOSFET 800 at various stages of fabrication associated with the method 700 of FIG. 7. The partially formed MOSFET of FIG. 8a includes a dummy gate structure 922. The dummy gate includes an upper portion 924 and an etch-stop portion 926.

The partially formed MOSFET further includes a substrate 110 and a relaxed SiGe layer 830 on the surface of the substrate 110. The relaxed SiGe layer 830 is in contact with the etch-stop portion 926 of the dummy gate structure 922. The partially formed MOSFET also includes an isolation region 871, source and drain regions 832, 842, and source and drain silicide contacts 831, 841.

FIG. 8b illustrates the partially formed MOSFET after the stage of fabrication of FIG. 8a. The dummy gate and etch-stop portion 926 have been removed, thus exposing a portion of the relaxed SiGe layer 830 where the etch-stop portion 926 formerly resided in the dummy gate structure 922. The partially formed MOSFET now includes a planarized dielectric layer 875 that was formed prior to removal of the dummy gate.

Figure 8C:
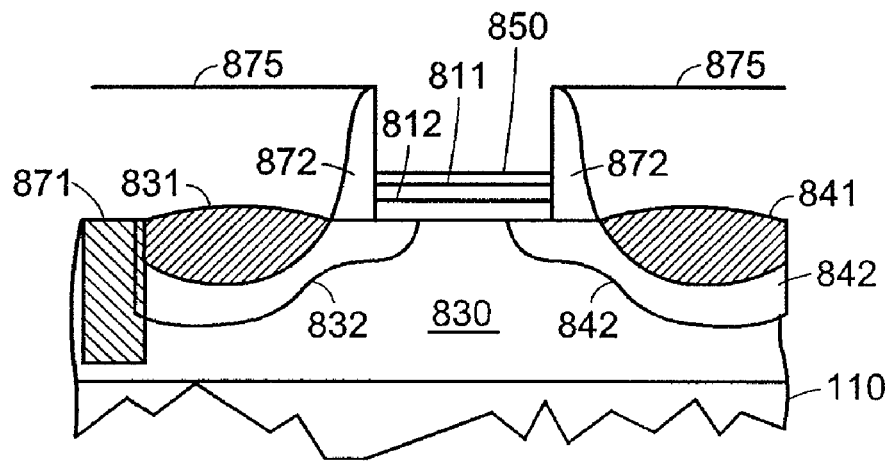
Figure 8D:
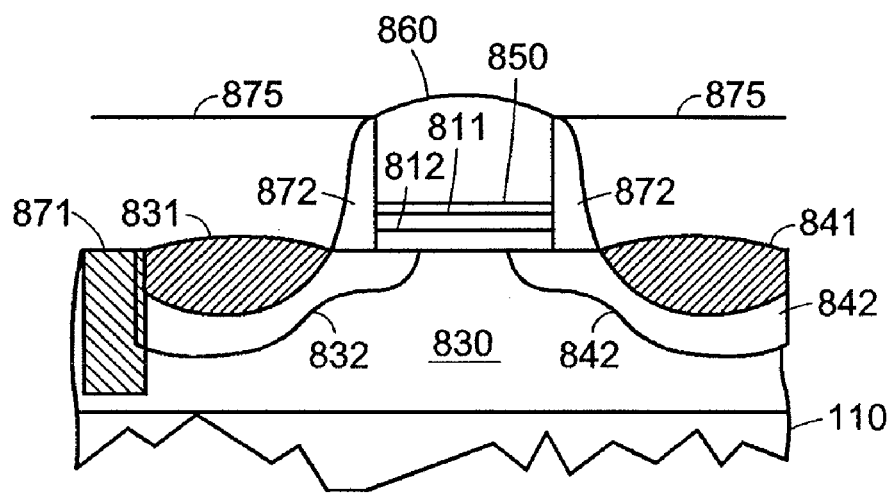

FIG. 8c illustrates a stage of fabrication occurring after that of FIG. 8b. A compressive SiGe layer 812, a tensile silicon layer 811, and a gate dielectric portion 850 have been deposited on the exposed area of the relaxed SiGe layer 830. In some implementations of a structure, the tensile silicon layer 811 is absent from some devices, e.g. PMOS devices. In some implementations of a structure, the compressively strained SiGe layer 812 is absent from some devices, e.g. NMOS devices. Lastly, FIG. 8d illustrates a stage of fabrication occurring after that of FIG. 8c. At this stage, a "real" gate 860 has been formed on the dielectric portion 850.

In an alternative implementation of the process illustrated in FIGS. 8a to 8d, a strained semiconductor layer may be formed in direct contact with buried insulator layers, wherein the strained semiconductor layer includes either a tensile silicon layer 811 or a compressive SiGe layer 812. For example, a tensilely strained silicon layer 811 may be in direct contact with the buried insulator layer. The compressive SiGe layer 812 may then be deposited as illustrated in FIG. 8c following removal of the dummy gate 922. In another embodiment, the strained semiconductor layer in direct contact with the buried insulator layer is the compressive SiGe layer 812. The tensile Si layer 811 may then be deposited as illustrated in FIG. 8c following removal of the dummy gate 922.

As described above, some embodiments of the invention utilize a virtual substrate that includes a SiGe strain-inducing substrate layer. The SiGe strain-inducing substrate layer can be grown on a silicon wafer, and can include more than one layer of alloys of varying composition, thickness and growth conditions. Thus, the strain-inducing substrate layer can include a SiGe layer or multiple SiGe layers and/or SiGe layers having a graded composition. In some embodiments, the SiGe layer includes a relaxed SiGe layer grown on intermediate SiGe layers that accommodate the lattice mismatch with a silicon wafer. In some embodiments, the strain-inducing substrate layer is a strained semiconductor layer in direct contact with an insulator layer, for example a strained silicon layer disposed on a silicon dioxide layer on a silicon substrate. The strained semiconductor layer may comprise silicon, germanium, and/or SiGe.

The substrate can include, for example, a silicon wafer, with the SiGe layers grown on the silicon wafer. In this case, an oxide layer can be present between the silicon wafer and the SiGe layer. Other types of materials can provide a base or substrate, e.g., silicon-on-insulator (SOI) wafers, germanium wafers, glass substrates and laminated substrates.

Silicon, germanium and SiGe layers can be formed, for example, via known epitaxial growth techniques. Growth of silicon, germanium or SiGe layers of suitable composition and thickness on a SiGe relaxed layer, enables production of a channel layer of controlled stress and dislocation density. Examples of SiGe substrates, in which the Ge content can be up to 100%, include: a relaxed, uniform composition SiGe layer on a graded composition SiGe layer atop a Si substrate; a relaxed, uniform composition SiGe layer directly adjacent to a Si substrate; and a relaxed, uniform composition SiGe layer on an insulating layer like $SiO_2$, adjacent a Si substrate.

Variations, modifications, and other implementations of what is described herein wilt occur to those of ordinary skill in the art without departing from the spirit and the scope of the invention as claimed. Accordingly, the invention is to be defined not by the preceding illustrative description but instead by the spirit and scope of the following claims.

What is claimed is:

1. A method for fabricating a semiconductor structure, the method comprising:

providing a substrate comprising a strain-inducing layer;

forming a dummy gate structure on the strain-inducing layer, the dummy gate structure comprising a dummy gate surrounded at least in part by a gate-defining material;

removing the dummy gate to expose a portion of the strain-inducing layer;

depositing a strained semiconductor adjacent the exposed portion of the strain-inducing layer; and performing a plurality of process steps after depositing the strained semiconductor, each one of the plurality of process steps occurring at temperatures no greater than approximately 600° C., wherein a concentration profile of the strained semiconductor comprises an atomic concentration gradient of at least one decade per nanometer after the plurality of process steps is performed.

2. The method of claim 1, wherein the strained semiconductor comprises a compressively strained semiconductor.

3. The method of claim 1, wherein the strained semiconductor comprises a tensilely strained semiconductor.

4. The method of claim 2, further comprising depositing a tensilely strained semiconductor above the compressively strained semiconductor.

5. The method of claim 1, further comprising forming at least one of a source and a drain in the substrate proximate the gate-defining material prior to depositing the strained semiconductor.

6. The method of claim 1, further comprising forming a contact on the substrate proximate the gate-defining material prior to depositing the strained semiconductor.

7. The method of claim 6, wherein after deposition of the strained semiconductor the concentration profile of the strained semiconductor comprises a first atomic concentration gradient of at least one decade per nanometer.

8. The method of claim 7, wherein the first atomic concentration gradient is at least two decades per nanometer.

9. The method of claim 1, wherein the atomic concentration gradient is at least two decades per nanometer.

10. The method of claim 1, further comprising forming a gate dielectric on the strained semiconductor.

11. The method of claim 1, wherein the strain-inducing layer comprises SiGe.

12. The method of claim 2, wherein the compressively strained semiconductor comprises SiGe having a germanium concentration greater than a germanium concentration of the strain-inducing layer.

13. The method of claim 3, wherein the tensilely strained semiconductor consists essentially of silicon.

14. The method of claim 13, further comprising forming a gate dielectric by oxidizing a portion of the tensilely strained semiconductor.

15. The method of claim 1, wherein the strain-inducing layer comprises a second strained semiconductor disposed directly above an insulator layer.

16. The method of claim 1, further comprising forming a gate dielectric by depositing a high-k dielectric over the strained semiconductor.

* * * * *